US012106817B2

(12) United States Patent
Chen et al.

(10) Patent No.: US 12,106,817 B2
(45) Date of Patent: Oct. 1, 2024

(54) METHOD FOR MANUFACTURING A MEMORY

(71) Applicant: Changxin Memory Technologies, Inc., Anhui (CN)

(72) Inventors: Longyang Chen, Hefei (CN); Zhongming Liu, Hefei (CN); Yexiao Yu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 475 days.

(21) Appl. No.: 17/403,570

(22) Filed: Aug. 16, 2021

(65) Prior Publication Data

US 2022/0319555 A1 Oct. 6, 2022

Related U.S. Application Data

(63) Continuation of application No. PCT/CN2021/105738, filed on Jul. 12, 2021.

(30) Foreign Application Priority Data

Mar. 30, 2021 (CN) .......................... 202110343740.5

(51) Int. Cl.
*G11C 5/06* (2006.01)
*H01L 21/762* (2006.01)
(Continued)

(52) U.S. Cl.
CPC ........ *G11C 5/063* (2013.01); *H01L 21/76224* (2013.01); *H01L 21/76816* (2013.01);
(Continued)

(58) Field of Classification Search
CPC .... H10B 12/488; H10B 12/482; H10B 12/48; H10B 12/315; H01L 29/785;
(Continued)

(56) References Cited

U.S. PATENT DOCUMENTS 8,058,678 B2  11/2011  Kim et al.
9,054,184 B2   6/2015  Mikasa
(Continued)

FOREIGN PATENT DOCUMENTS

CN   102479803 A    5/2012
CN   107482007 A   12/2017
(Continued)

OTHER PUBLICATIONS

PCT International Search Report and the Written Opinion mailed Dec. 30, 2021, issued in related International Application No. PCT/CN2021/105738, with partial English translation (9 pages).
(Continued)

*Primary Examiner* — Jaehwan Oh
*Assistant Examiner* — John M Parker
(74) *Attorney, Agent, or Firm* — Sheppard Mullin Richter & Hampton LLP

(57) ABSTRACT

This application provides a method for manufacturing a memory and a memory thereof. The manufacturing method includes: providing a substrate, where the substrate includes a plurality of spaced active area and each of the plurality of spaced active area includes a first contact region and a second contact region; forming a plurality of spaced bit lines on the substrate, where each of the plurality of spaced bit lines is connected to at least one first contact region; forming a first isolation layer on each of the plurality of spaced bit lines, a first trench extending in a first direction between two adjacent first isolation layers of the plurality of spaced bit lines; etching a bottom along the first trench to form a second trench; and forming a plurality of conducting wires and a plurality of second isolation layers in the second trench.

20 Claims, 16 Drawing Sheets

(51) Int. Cl.
  *H01L 21/768* (2006.01)
  *H01L 23/522* (2006.01)
  *H01L 23/528* (2006.01)
  *H01L 23/532* (2006.01)
  *H10B 12/00* (2023.01)

(52) U.S. Cl.
  CPC .... *H01L 21/76831* (2013.01); *H01L 23/5226* (2013.01); *H01L 23/5283* (2013.01); *H01L 23/53266* (2013.01); *H10B 12/315* (2023.02); *H10B 12/482* (2023.02); *H10B 12/485* (2023.02)

(58) Field of Classification Search
  CPC ......... H01L 21/76224; H01L 21/76816; H01L 21/76831; G11C 5/063
  See application file for complete search history.

(56) References Cited

U.S. PATENT DOCUMENTS

| | | | |
|---|---|---|---|
| 10,043,809 B1 | 8/2018 | Chang et al. | |
| 10,607,996 B1 | 3/2020 | Sasaki | |
| 11,074,965 B2 | 7/2021 | Wang et al. | |
| 11,683,927 B2* | 6/2023 | Ishigami | H10B 12/315 257/306 |
| 2012/0086060 A1* | 4/2012 | Taniguchi | H01L 21/76232 257/296 |
| 2015/0056801 A1* | 2/2015 | Park | H01L 21/7682 438/655 |
| 2018/0301412 A1* | 10/2018 | Borsari | H10B 12/315 |
| 2019/0103302 A1 | 4/2019 | Yoon | |
| 2019/0348418 A1* | 11/2019 | Hwang | H01L 23/535 |
| 2021/0312975 A1 | 10/2021 | Wang et al. | |

FOREIGN PATENT DOCUMENTS

| | | |
|---|---|---|
| CN | 107946302 A | 4/2018 |
| CN | 109037155 A | 12/2018 |
| CN | 111584488 A | 8/2020 |
| CN | 111627910 A | 9/2020 |
| CN | 111640744 A | 9/2020 |
| KR | 2010-0087915 A | 8/2010 |

OTHER PUBLICATIONS

Extended European Search Report dated Aug. 2, 2022, issued in related European Patent Application No. 21786737.3 (9 pages).
Examination Report dated Mar. 16, 2023, issued in related European Patent Application No. 21786737.3 (4 pages).

* cited by examiner

METHOD FOR MANUFACTURING A MEMORY

CROSS-REFERENCE TO RELATED APPLICATIONS

This application is a continuation application of International Patent Application No.: PCT/CN2021/105738, filed on Jul. 12, 2021, which claims priority to claims priority to Chinese Patent Application No.: 202110343740.5, filed on Mar. 30, 2021. The above-referenced applications are incorporated herein by reference in their entirety.

TECHNICAL FIELD

This application relates to the technical field of storage devices, and in particular, to a method for manufacturing a memory and a memory.

BACKGROUND

A Dynamic Random Access Memory (DRAM) is a semiconductor memory which writes and reads data at a high speed, and is widely used in various electronic devices due to its high storage density and fast reading and writing speeds.

In the related art, a DRAM generally includes a substrate. The substrate includes active area, and the substrate is provided with spaced bit lines and an isolation layer covering the bit lines. A bit line is electrically connected to an active area, a via extending to the active area is formed in the isolation layer, a conducting wire is filled in the via, and the conducting wire is electrically connected to the active area. To increase the contact area between the conducting wire and the active area, a contact recess is usually formed on a surface of the substrate in the via. However, in a process of manufacturing a memory, a conductive layer of a bit line is apt to be exposed or even be damaged, and as a result, the bit line is connected to another structure, causing a relatively low yield of the memory.

SUMMARY

A method for manufacturing a memory according to various embodiments of this application includes: providing a substrate, where the substrate includes a plurality of spaced active area and each of the plurality of spaced active area includes a first contact region and a second contact region; forming a plurality of spaced bit lines on the substrate, where each of the plurality of spaced bit lines is connected to at least one first contact region and each of the plurality of spaced bit lines includes a first conductive layer, a first protection layer, and a barrier layer stacked in sequence, the first conductive layer being located on the substrate; forming a first isolation layer on each of the plurality of spaced bit lines, a first trench extending in a first direction between two adjacent first isolation layers of the plurality of spaced bit lines; etching a bottom along the first trench to form a second trench, the second trench exposing the second contact region; and forming a plurality of conducting wires and a plurality of second isolation layers in the second trench, top surfaces of the plurality of conducting wires and top surfaces of the plurality of second isolation layers being located in first trenches, the plurality of conducting wires and the plurality of second isolation layers being alternately arranged in the first direction, and each of the plurality of conducting wires being connected to a second contact region.

active areaactive areaAn embodiment of this application further provides a memory, including: a substrate, where the substrate includes a plurality of spaced active area and each of the plurality of spaced active area includes a first contact region and a second contact region; a plurality of spaced bit lines, where each of the plurality of spaced bit lines is connected to at least one first contact region and each of the plurality of spaced bit lines includes a first conductive layer, a first protection layer, and a barrier layer stacked in sequence, the first conductive layer being located on the substrate; and isolation layers covering the plurality of spaced bit lines and the substrate, where each of the isolation layers is provided with vias running through the isolation layers, and conducting wires extending to the substrate and electrically connected to the second contact region provided through the vias.

DETAILED DESCRIPTION OF THE EMBODIMENTS

Figure 1:
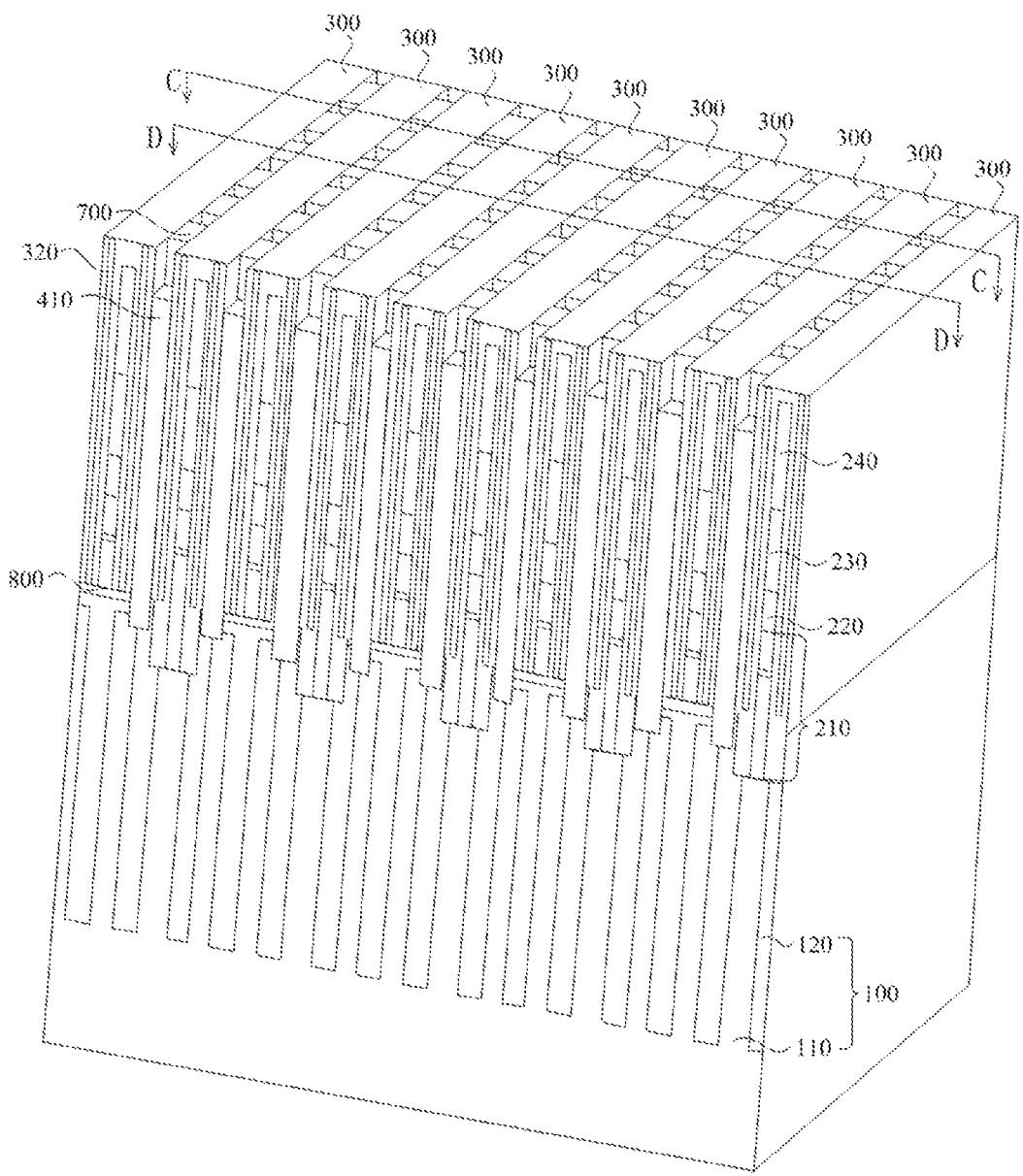
FIG. 1 is a schematic structural diagram of a memory according to an embodiment of this application.

In related technology, when manufacturing a memory, generally, a plurality of bit lines and a first isolation layer covering the plurality of bit lines are formed on a substrate, where the substrate includes a plurality of spaced active area, each of the plurality of spaced active area includes a first contact region and a second contact region, each of the plurality of spaced bit lines is connected to at least one first contact region, and a first trench is formed between first isolation layers of two adjacent bit lines; an intermediate layer is deposited in the first trench, where the first trench is filled up with the intermediate layer; the intermediate layer is etched to form first through-holes, where remaining intermediate layer forms a plurality of spaced columnar structures, and each of the plurality of spaced columnar structures corresponds to one second contact region; a second isolation layer is deposited in the first through-holes; the remaining intermediate layer is removed to form second through-holes; the substrate is etched along the second through-holes to form contact recesses, where the contact recesses exposes the second contact regions; and a conductive material is filled in the contact recesses and the second through-holes to form conducting wires.

In the above-mentioned manufacturing process, when etching the substrate along the second through-hole, the first isolation layer outside the plurality of spaced bit lines is apt to be etched through, and as a result, conducting wires are conducted to the plurality of spaced bit lines, further conducting wireing to failure of the memory and a relatively low yield of the memory. In addition, the intermediate layer is removed through etching twice, which makes the removal process complicated, and the residual intermediate layer may further conducting wire to the relatively low yield of the memory.

To this end, the manufacturing process of the memory may be changed, that is, first, a bottom of the first trench is etched along the first trench formed by the first isolation layer to form a second trench; a second conductive layer is formed in the first trench and the second trench; and then the second conductive layer is etched to disconnect the second conductive layer and form the conducting wires. However, in the above-mentioned process, when etching the second conductive layer, parts of the first isolation layer may also be removed, so that the plurality of spaced bit lines in the first isolation layer is apt to be exposed or even damaged, resulting in relatively low yield of the memory.

To prevent exposure or even damage of a first conductive layer of a bit line in a process of manufacturing a memory, various embodiments of this application provides a method for manufacturing a memory, including: providing a substrate, where the substrate includes a plurality of spaced active area and each of the plurality of spaced active area includes a first contact region and a second contact region; forming a plurality of spaced bit lines on the substrate, where each of the plurality of spaced bit lines is connected to at least one first contact region, and each of the plurality of spaced bit lines includes a first conductive layer, a first protection layer, and a barrier layer stacked in sequence, the first conductive layer being located on the substrate; forming a first isolation layer on each of the plurality of spaced bit lines, a first trench extending in a first direction between two adjacent first isolation layers of the plurality of spaced bit lines; etching a bottom along the first trench to form a second trench, the second trench exposing the second contact region; and forming a plurality of conducting wires and a plurality of second isolation layers in the second trench, top surfaces of the plurality of conducting wires and top surfaces of the plurality of second isolation layers being located in the first trench, the plurality of conducting wires and the plurality of second isolation layers being alternately arranged in the first direction, and each of the plurality of conducting wires being connected to one second contact region. By disposing the barrier layer above the first conductive layer, the barrier layer is difficult to remove, and the barrier layer can reduce risk of exposing the first conductive layer, thereby avoiding an electrical connection between a bit line and another structure, to improve yield of the memory.

To make the objectives, features, and advantages of various embodiments of this application more apparent and easy to understand, the following clearly and completely describes technical solutions in the embodiments of this application with reference to accompanying drawings in the embodiments of this application. Apparently, the described embodiments are merely some exemplary embodiments of this application. Other embodiments derived based on the embodiments of this application by a person of ordinary skill in the art without creative efforts shall fall within the protection scope of this application.

Figure 2:
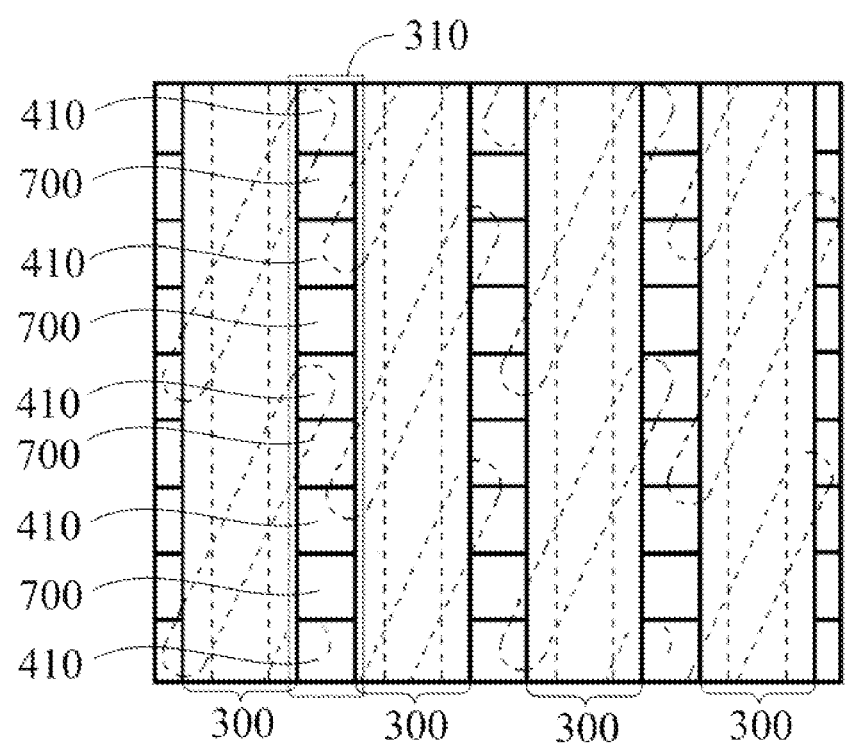
FIG. 2 is a top view of a schematic structural diagram of a memory according to an embodiment of this application.
Figure 3:
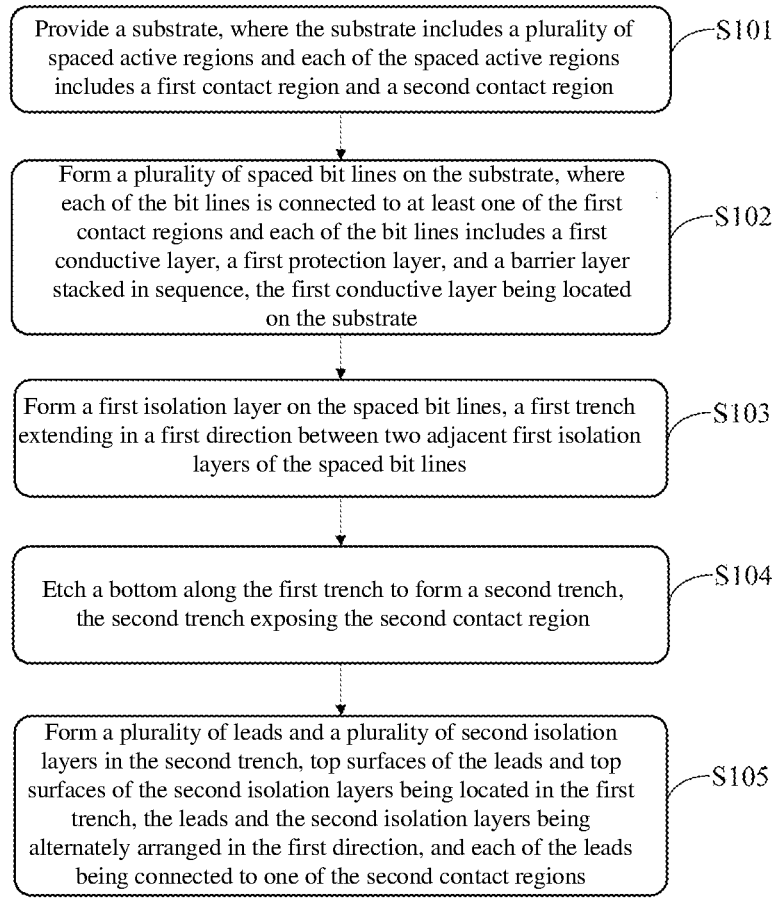
FIG. 3 is a flowchart of a method for manufacturing a memory according to an embodiment of this application.
Figure 4:
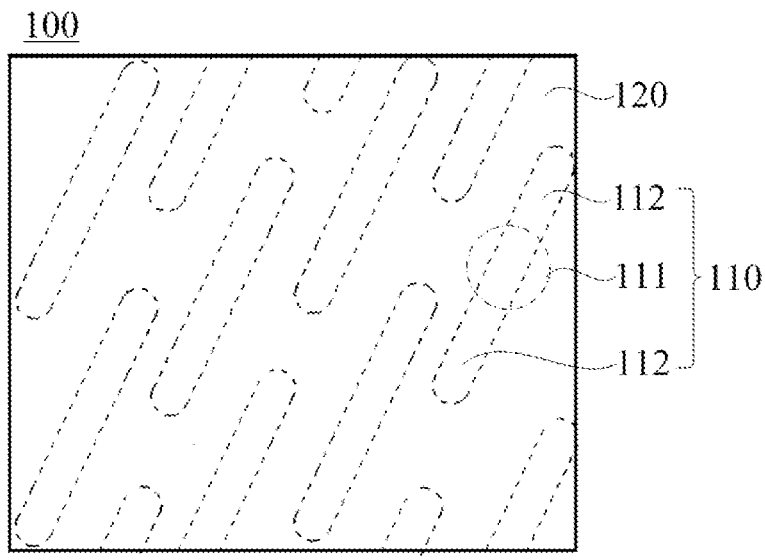
FIG. 4 is a top view of a substrate according to an embodiment of this application.

Referring to FIG. 1 to FIG. 4, FIG. 1 is a schematic structural diagram of a memory according to an embodiment of this application, FIG. 2 is top view of FIG. 1, FIG. 3 is a flowchart of a method for manufacturing a memory according to an embodiment of this application, and FIG. 4 is a top view of a substrate according to an embodiment of this application.

The memory shown in FIG. 1 has two cross sections at positions C and D. The cross section at the position C is a central plane of trenches of the memory, that is, the cross section at the position C is perpendicular to an extending direction of bit lines 200 and passes through a word line. The cross section at the position D is perpendicular to the extending direction of the bit lines 200 and passes through a plurality of spaced active area 110. Referring to FIG. 3, the method of FIG. 3 includes the following steps.

Step S101. Provide a substrate, where the substrate includes a plurality of spaced active area and each of the plurality of spaced active area includes a first contact region and a second contact region.

Referring to FIG. 4, FIG. 4 shows the top view of the substrate 100. As shown in FIG. 4, the plurality of spaced active area 110 is disposed in the substrate 100, and the plurality of spaced active area 110 is shown by dotted lines in FIG. 4, that is, the plurality of spaced active area 110 is not exposed out of a surface of the substrate 100. For example, the substrate 100 further includes an insulation layer, such as a silicon oxide layer, covering the plurality of active area 110, to isolate the plurality of spaced active area 110.

The plurality of spaced active area 110 is disposed at intervals. For example, the plurality of spaced active area 110 can be arranged in an array. In a possible example, shallow trench isolation (referred to as STI for short) structures 120 are disposed between the plurality of spaced active area 110, and silicon oxide (SiO2) is filled in the STI structures 120. The plurality of spaced active area 110 is isolated by the STI structures 120.

Still referring to FIG. 4, each of the plurality of spaced active area 110 may include a first contact region 111 and a second contact region 112. For example, the first contact region 111 and the second contact region 112 may be adjacent, the first contact region 111 being connected to a bit line and the second contact region 112 being connected to a capacitor, to enable the bit line to read data information from the capacitor or write data information to the capacitor, so that the memory can operate normally.

In a possible example, the first contact region 111 is located at a center of each of the plurality of spaced active area 110, and the second contact regions 112 are located at both ends of each of the plurality of spaced active area 110, that is, the second contact regions 112 are located on both sides of the first contact region 111, where the plurality of spaced active area 110 may include silicon (Si). Certainly, a material of the plurality of spaced active area 110 is not limited thereto, and for example, a material of an active area may be germanium (Ge), silicon on insulator (referred to as SOI for short), or the like. In some embodiments, a word line is further disposed in the substrate 100, and the word line may be an embedded word line.

Referring to step S102 of FIG. 3. Form a plurality of spaced bit lines on the substrate, where each of the plurality of spaced bit lines is connected to at least one first contact region; and each of the plurality of spaced bit lines includes a first conductive layer, a first protection layer, and a barrier layer stacked in sequence, the first conductive layer being located on the substrate.

Figure 5:
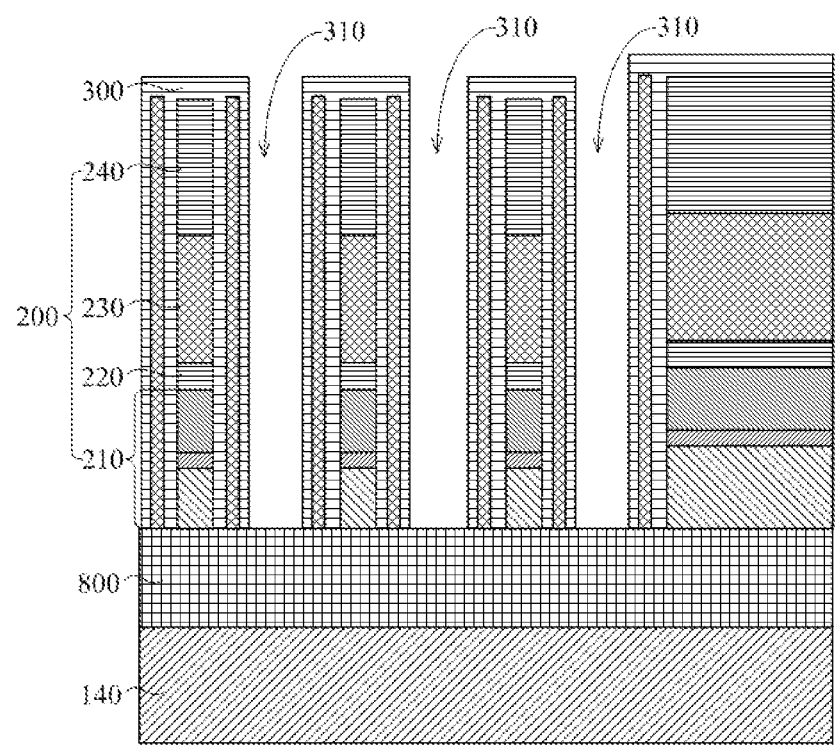
FIG. 5 is a cross-sectional view of a position C after a first isolation layer is formed according to an embodiment of this application.
Figure 6:
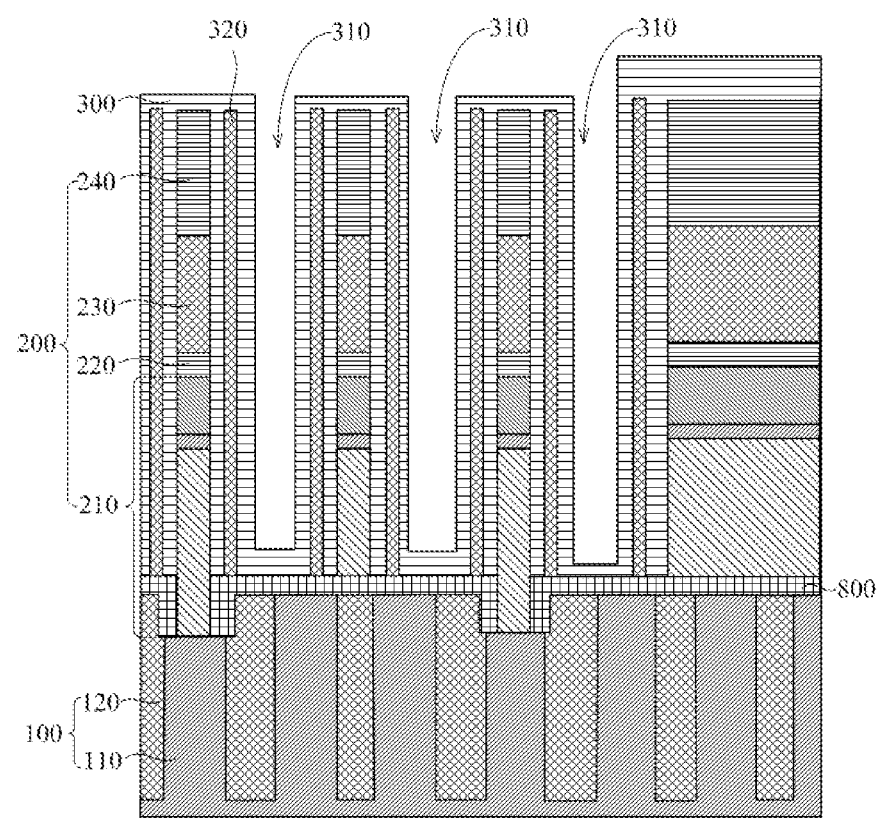
FIG. 6 is a cross-sectional view of a position D after a first isolation layer is formed according to an embodiment of this application.

Referring to FIG. 5 and FIG. 6, FIG. 5 is a cross-sectional view of the position C after a first isolation layer is formed according to an embodiment of this application, and FIG. 6 is a cross-sectional view of the position D after the first isolation layer is formed according to an embodiment of this application. It can be understood that after the first isolation layer is formed, the cross-sectional view of the position C shown in FIG. 5 is obtained by using a plane that is perpendicular to an extending direction of the plurality of spaced bit lines 200 and passes through a word line 140 as a cross section, and a cross-sectional view shown in FIG. 6 is obtained by using a plane that is perpendicular to the extending direction of the plurality of spaced bit lines 200 and passes through the plurality of spaced active area 110 as a cross section. For meanings of the cross-sectional views at positions C and D in the following embodiments, reference may be made to the above content and details are not described again.

As shown in FIG. 5 and FIG. 6, the plurality of spaced bit lines 200 are formed on the substrate 100 and each of the plurality of spaced bit lines 200 is connected to at least one first contact region (e.g., 111). The plurality of spaced bit lines 200 is parallel to each other and extends in a first direction. Each of the plurality of spaced bit lines 200 is connected to a plurality of first contact regions 111 in a same column, that is, the plurality of first contact regions 111 in the same column are connected to one bit line of the plurality of spaced bit lines 200.

There is an angle between an orthographic projection of the plurality of spaced bit lines 200 on the substrate 100 and an orthographic projection of the plurality of spaced active area 110 on the substrate 100. In an orientation shown in FIG. 2, the plurality of spaced bit lines 200 is disposed vertically, the plurality of spaced active area 110 is disposed obliquely, and the plurality of spaced active area 110 is parallel to each other.

In some embodiments, a third isolation layer 800 is further disposed on the substrate 100, as shown in FIG. 5 and FIG. 6, to further isolate and protect the plurality of spaced active area 110. For example, the third isolation layer 800 is silicon nitride. Bit line contact regions are formed in the third isolation layer 800 and the substrate 100 and the bit line contact regions expose the first contact regions 111. The plurality of spaced bit lines 200 is formed in the bit line contact region and is in contact with the plurality of first contact regions 111, so that the plurality of spaced bit lines 200 is electrically connected to the plurality of first contact regions 111.

Continuously referring to FIG. 5 and FIG. 6, each of the plurality of spaced bit lines 200 includes a first conductive layer 210, a first protection layer 220, and a barrier layer 230 stacked in sequence, and the first conductive layer 210 is located on the substrate 100 and is electrically connected to the first contact region 111.

A material of the first conductive layer 210 includes polycrystalline silicon, titanium nitride, and tungsten. For example, the first conductive layer 210 may be of a stack structure, as shown in FIG. 5 and FIG. 6, the first conductive layer 210 includes a polycrystalline silicon layer disposed on the substrate 100, a titanium nitride (TiN) layer disposed on the polycrystalline silicon layer, and a tungsten (W) layer disposed on the titanium nitride layer.

Still referring to FIG. 5 and FIG. 6, the first protection layer 220 isolates and protects the first conductive layer 210. A thickness of the first protection layer 220 may be in a range of 20 nm to 40 nm, and the first protection layer 220 includes silicon nitride ($Si_3N_4$). As shown in FIG. 5 and FIG. 6, the thickness of the first protection layer 220 is a distance in a vertical direction, that is, a height in a direction away from the substrate 100.

A thickness of the barrier layer 230 is in a range of 20 nm to 80 nm, and the barrier layer 230 includes silicon oxide. An etch rate selectivity of subsequently formed conducting wires 410 and the barrier layer 230 is greater than 100, so that in the process of etching a second conductive layer 400 to form conducting wires, the barrier layer 230 is less etched, and further it is difficult to etch to the first conductive layer 210, thereby reducing risk of exposure of the first conductive layer 210 and improving yield of the memory.

Still referring to FIG. 5 and FIG. 6, each of the plurality of spaced bit lines 200 may further include a second protection layer 240, which is disposed on the barrier layer 230. A thickness of the second protection layer 240 is in a range of 20 nm to 80 nm, and the second protection layer 240 includes silicon nitride.

In a possible example, a first preset conductive layer, a first preset protection layer, a preset barrier layer, and a second preset protection layer are sequentially deposited on the substrate 100; and then parts of the first preset conductive layer, parts of the first preset protection layer, parts of the preset barrier layer, and parts of the second preset protection layer are removed, to expose the substrate 100.

It can be understood that the remaining first preset conductive layer forms the first conductive layer 210, the remaining first preset protection layer forms the first protection layer 220, the remaining preset barrier layer forms the barrier layer 230, and the remaining second preset protection layer forms the second protection layer 240. Certainly, forming of the plurality of spaced bit lines 200 is not limited and may be implemented by layer-by-layer deposition. For example, the first protection layer 220, the barrier layer 230, and the second protection layer 240 are sequentially deposited on the first conductive layer 210.

Referring to step S103 of FIG. 3. Form a first isolation layer on the plurality of spaced bit lines, a first trench extending in a first direction between two adjacent first isolation layers of the plurality of spaced bit lines.

Still referring to FIG. 5 and FIG. 6, after the plurality of spaced bit lines 200 are formed, a first isolation layer 300 is formed on the plurality of spaced bit lines 200 and the first isolation layer 300 covers the plurality of spaced bit lines 200. As shown in FIG. 5 and FIG. 6, the first isolation layer 300 is formed on upper surfaces and side surfaces of the plurality of spaced bit lines 200 and the first isolation layer 300 may be an insulation material such as silicon nitride.

A first trench 310 is formed between two adjacent first isolation layers 300, that is, both sidewalls of the first trench 310 are the first isolation layer 300. As shown in FIG. 5 and FIG. 6, the first trench 310 extends in a first direction and it can be understood that the first direction of the first trench 310 is the same as the extending direction of the plurality of spaced bit lines 200.

A plurality of oxide layers 320, such as silicon oxide, may further be provided in the first isolation layer 300, as shown in FIG. 5 and FIG. 6. Both sides of each bit line are each provided with an oxide layer 320. The oxide layer 320 extends in a first direction, that is, the extending direction of the oxide layer 320 is the same as the extending direction of the plurality of spaced bit lines 200. It can be understood that nitride-oxide-nitride (referred to as NON for short) are sequentially formed outside of the plurality of spaced bit lines 200 in a direction from the plurality of spaced bit lines 200 to the first trench 310.

Referring to step S104 of FIG. 3. Etch a bottom along the first trench to form a second trench, the second trench exposing the second contact region.

Figure 7:
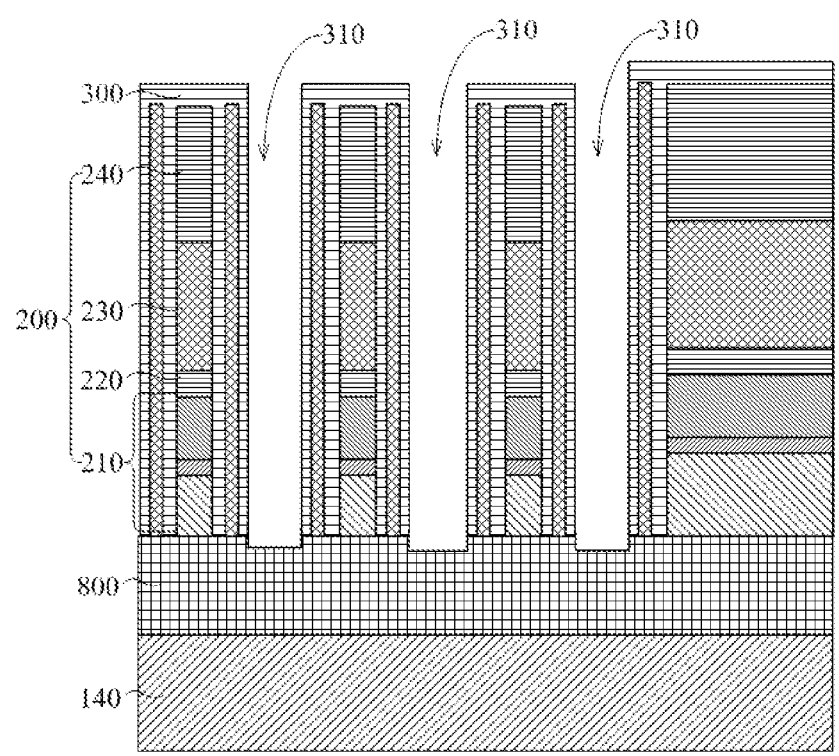
FIG. 7 is a cross-sectional view of a position C after second trenches are formed according to an embodiment of this application.
Figure 8:
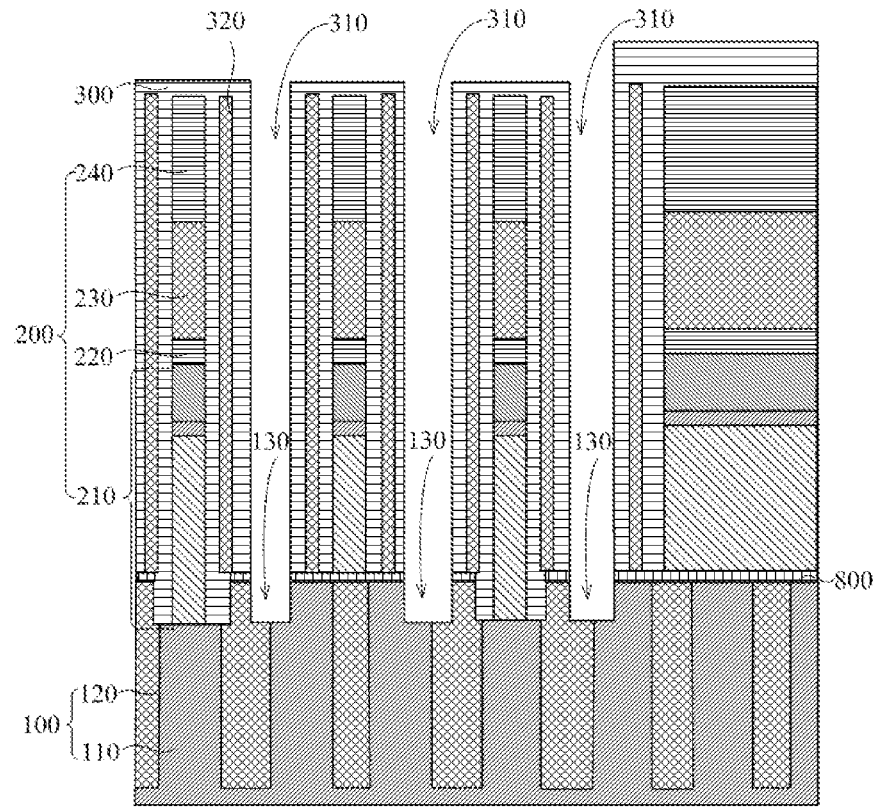
FIG. 8 is a cross-sectional view of a position D after the second trenches are formed according to an embodiment of this application.

Referring to FIG. 7 and FIG. 8, a bottom of the first trench 310 is etched along the first trench 310 to form a second trench 130, which is easily formed. A bottom of the second trench 130 is located in the substrate 100, as shown in FIG. 8, and the second trench 130 exposes the second contact region 112.

In a possible example, the first isolation layer 300 further covers the substrate 100, that is, the first isolation layer 300 is deposited on the plurality of spaced bit lines 200 and the substrate 100. When etching the bottom of the first trench 310 along the first trench 310, the first isolation layer 300 and the substrate 100 are etched, and the bottom of the formed second trench 130 is located in the substrate 100.

It can be understood that, in some possible examples, when etching the first isolation layer 300 and the substrate 100 along the first trench 310, parts of the first isolation layer 300 away from the substrate 100 may also be removed, so that the oxide layer 320 is exposed out of a surface of the first isolation layer 300 and the oxide layer 320 is exposed out of a top surface of the first isolation layer 300.

Referring to step S105 of FIG. 3. Form a plurality of conducting wires and a plurality of second isolation layers in the second trench, top surfaces of the plurality of conducting wires and top surfaces of the plurality of second isolation layers being located in the first trench, the plurality of conducting wires and the plurality of second isolation layers being alternately arranged in the first direction, and each of the conducting wires being connected to one of the second contact regions.

A plurality of conducting wires 410 and a plurality of second isolation layers 700 are disposed in each second trench 130, as shown in FIG. 1 and FIG. 2, the plurality of conducting wires 410 and the second isolation layers 700 are alternately arranged in a first direction, and each of the plurality of conducting wires 410 is connected to one second contact region 112. The plurality of conducting wires 410 is isolated between the first isolation layer 300 and the second isolation layers 700, to prevent the plurality of conducting wires 410 from being interconnected. The plurality of conducting wires 410 may be arranged in an array in the memory. For example, as shown in FIG. 1 and FIG. 2, the plurality of conducting wires 410 may be arranged in a square array.

Top surfaces of the plurality of conducting wires 410 and top surfaces of the plurality of second isolation layers 700 are located in the first trench 310, and the top surfaces of the plurality of conducting wires 410 may not be flush with the top surfaces of the plurality of second isolation layer 700. As shown in FIG. 1, for example, the top surfaces of the plurality of second isolation layers 700 are flush with the top surface of the first isolation layer 300, and the top surfaces of the plurality of conducting wires 410 are lower than the top surface of the first isolation layer 300, so that capacitively contact pads are formed on the plurality of conducting wires 410. In some embodiments, a material of the plurality of second isolation layers 700 may be the same as the material of the first isolation layer 300.

The top surfaces of the plurality of conducting wires 410 may be higher than or lower than the top surface of the first conductive layer 210. That is, the top surfaces of the plurality of conducting wires 410 may be located on a side of the first conductive layer 210 away from the substrate 100 or on a side of the first conductive layer 210 close to the substrate 100.

In a possible example, a difference between a height of top surfaces of the plurality of conducting wires 410 and a height of a top surface of the first conductive layer 210 is in a range of −15 nm to 30 nm. The height of the top surfaces of the plurality of conducting wires 410 refers to the distance between the top surfaces of the plurality of conducting wires 410 and a top surface of the substrate 100. The height of the top surface of the first conductive layer 210 refers to the distance between the top surface of the first conductive layer 210 and the top surface of the substrate 100. The difference between the height of the top surfaces of the plurality of conducting wires 410 and the height of the top surface of the first conductive layer 210 is a value obtained by subtracting the height of the top surfaces of the conducting wires 410 by the height of the top surface of the first conductive layer 210.

It can be understood that the difference between the height of the top surfaces of the plurality of conducting wires 410 and the height of the top surface of the first conductive layer 210 being negative indicates that the top surfaces of the plurality of conducting wires 410 are located on the side of the first conductive layer 210 close to the substrate 100, and the difference between the height of the top surfaces of the plurality of conducting wires 410 and the height of the top surface of the first conductive layer 210 being positive indicates that the top surfaces of the plurality of conducting wires 410 are located on the side of the first conductive layer 210 away from the substrate 100, as shown in FIG. 1.

Referring to FIG. 3, in the method for manufacturing the memory according to the embodiment of this application, first, a substrate 100 is provided, where the substrate 100 includes a plurality of spaced active area 110, and each of the plurality of spaced active area 110 includes a first contact region 111 and a second contact region 112. A plurality of spaced bit lines 200 are formed on the substrate 100, where each of the plurality of spaced bit lines 200 is connected to at least one first contact region 111; and each of the plurality of spaced bit lines 200 includes a first conductive layer 210, a first protection layer 220, and a barrier layer 230 stacked in sequence, the first conductive layer 210 being located on the substrate 100. By disposing the barrier layer 230 on the first conductive layer 210, the barrier layer 230 is difficult to remove, and the barrier layer 230 can reduce the risk of exposure of the first conductive layer 210, thereby avoiding electrical connections between the plurality of spaced bit lines 200 and another structure, to improve yield of the memory. A first isolation layer 300 is then formed on each of the plurality of spaced bit lines 200, a first trench 310 extending in a first direction between two adjacent first isolation layers 300 of the plurality of spaced bit lines 200. A bottom of the first trench 310 is etched along the first trench 310 to form a second trench 130, the second trench 130 exposing the second contact region 112. A plurality of conducting wires 410 and a plurality of second isolation layers 700 are formed in the second trench 130, top surfaces of the plurality of conducting wires 410 and top surfaces of the second isolation layers 700 are located in the first trench 310. The plurality of conducting wires 410 and the plurality of second isolation layers 700 are alternately arranged in the first direction, and each of the plurality of conducting wires 410 is connected to the second contact region 112. Each of the plurality of conducting wires 410 is further electrically connected to a capacitive contact pad, which is electrically connected to a capacitor, so that the capacitor is electrically connected to a bit line of the plurality of spaced bit line 200 through which data information stored in the capacitor can be read or data information can be written to the capacitor.

Figure 9:
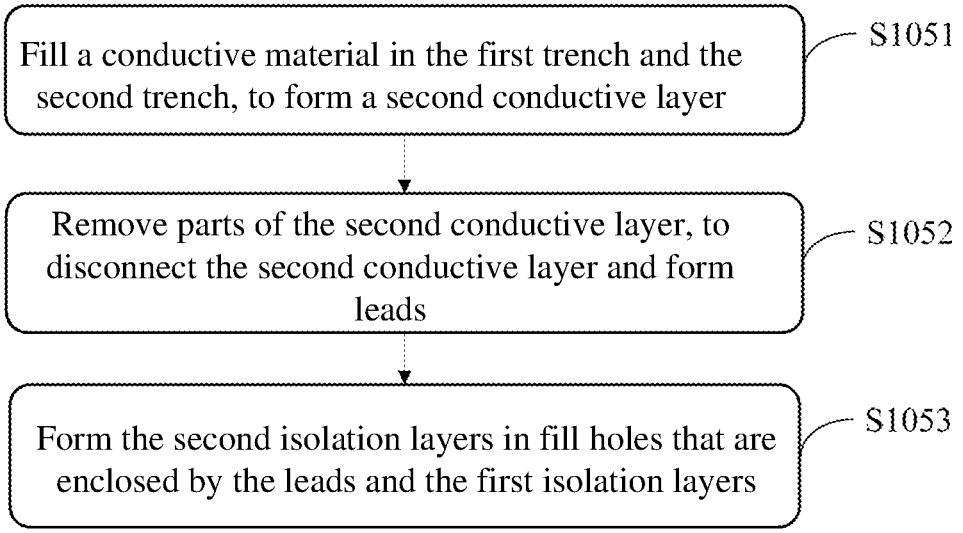
FIG. 9 is a flowchart of forming a plurality of conducting wires and a plurality of second isolation layers in a second trench according to an embodiment of this application.

Referring to FIG. 9, forming the plurality of conducting wires and the plurality of second isolation layers in the second trench includes:

Step S1051. Fill a conductive material in the first trench and the second trench, to form a second conductive layer.

Figure 10:
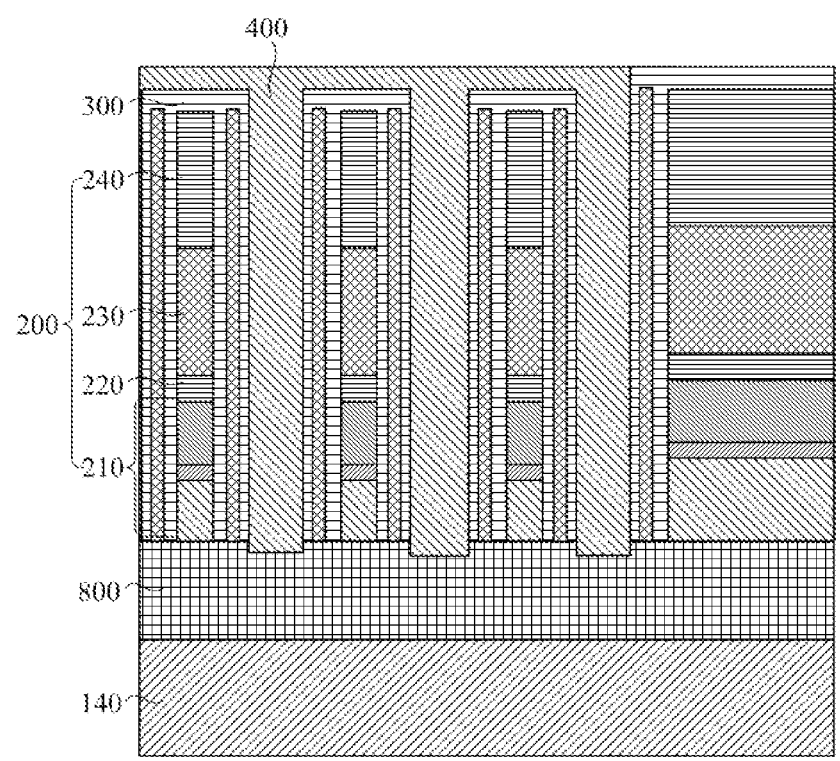
FIG. 10 is a cross-sectional view of a position C after a second conductive layer is formed according to an embodiment of this application.
Figure 11:
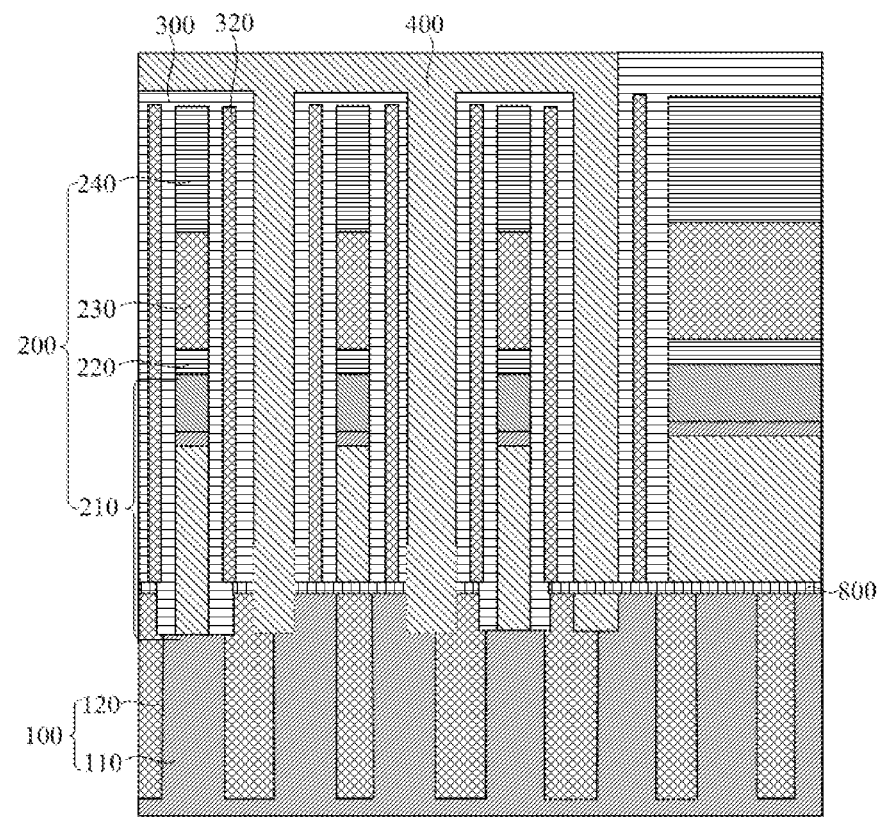
FIG. 11 is a cross-sectional view of a position D after a second conductive layer is formed according to an embodiment of this application.

Referring to FIG. 10 and FIG. 11, a conductive material is filled in the first trench 310 and the second trench 130, to form a second conductive layer 400. For example, the second conductive layer 400 is formed in the first trench 310 and the second trench 130 by Chemical Vapor Deposition (CVD), Physical Vapor Deposition (PVD), Atomic Layer Deposition (ALD), or the like.

As shown in FIG. 10 and FIG. 11, the second conductive layer 400 is filled in the first trench 310 and the second trench 130 and covers a surface of the first isolation layer 300 that is away from the substrate 100. A conductive material may be polycrystalline silicon, that is, the material of the second conductive layer 400 may be polycrystalline silicon.

When forming the second conductive layer 400, a filling space of the first trench 310 and the second trench 130 is relatively large, the filling difficulty is relatively low, and the filling quality is relatively good. Voids and/or seams caused by the non-uniform filling of the second conductive layer 400 are reduced, thereby improving the forming quality of the second conductive layer 400, and further improving the yield of the memory.

Figure 12:
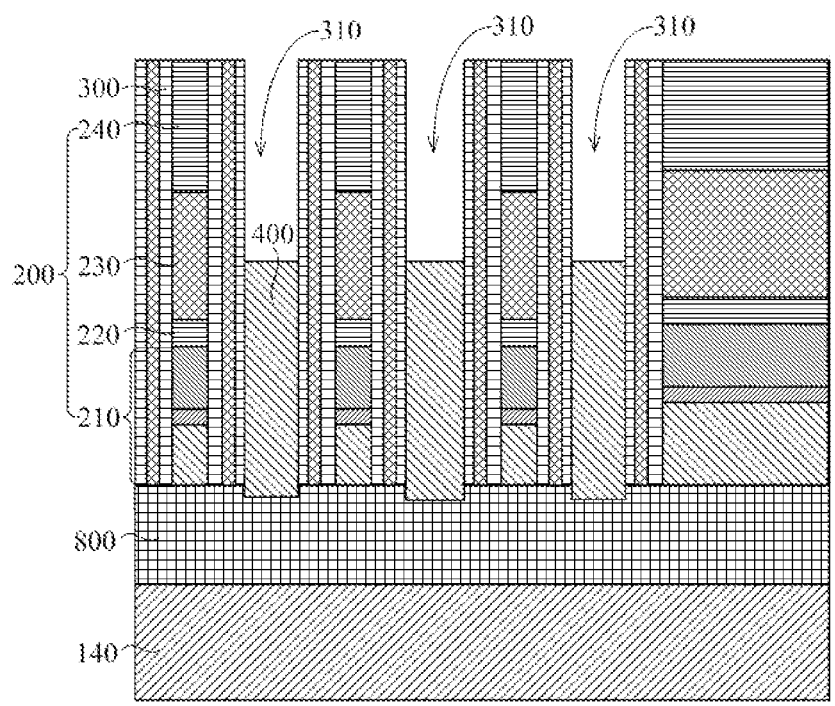
FIG. 12 is a cross-sectional view of a position C after parts of a second conductive layer are removed according to an embodiment of this application.
Figure 13:
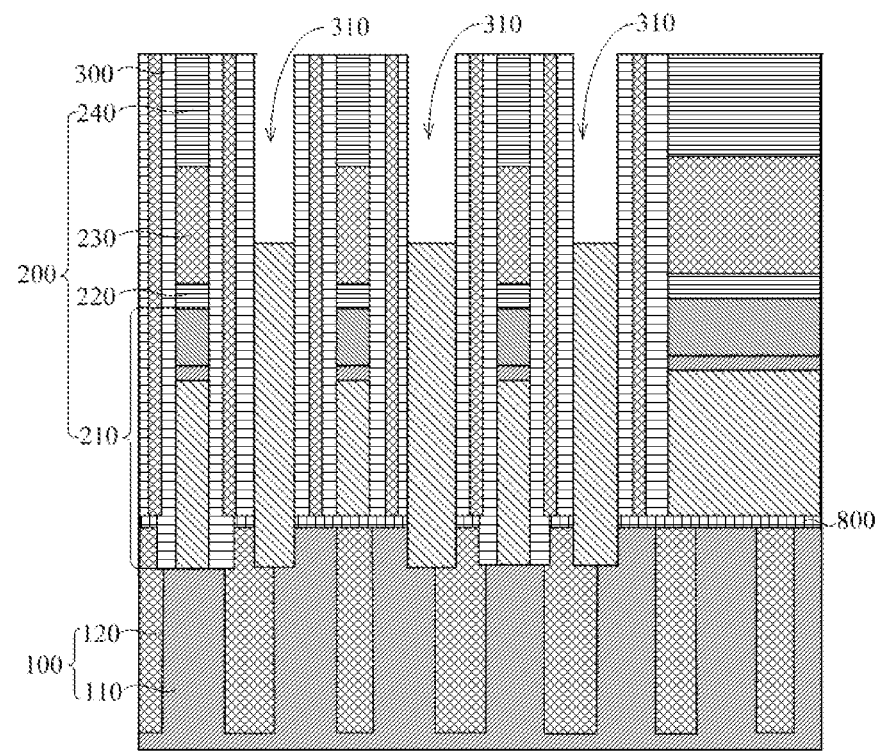
FIG. 13 is a cross-sectional view of a position D after parts of a second conductive layer are removed according to an embodiment of this application.

It should be noted that after forming the second conductive layer 400, the method for manufacturing the memory may further include the following step: removing parts of the second conductive layer 400 away from the substrate 100 to expose parts of the first trench 310. Referring to FIG. 12 and FIG. 13, the second conductive layer 400 located on the first isolation layer 300 is etched off, and parts of the second conductive layer 400 located in the first trench 310 are etched off. As shown in FIG. 12 and FIG. 13, partial regions of the second conductive layer 400 away from the substrate 100 are etched off.

It can be understood that after the second conductive layer 400 is formed, the second conductive layer 400 is etched back, to expose an upper portion of the first trench 310. As shown in FIG. 12 and FIG. 13, after the parts of the second conductive layer 400 are removed, a sidewall of the first trench 310 is exposed, that is, parts of a side surface of the first isolation layer 300 are exposed.

Figure 14:
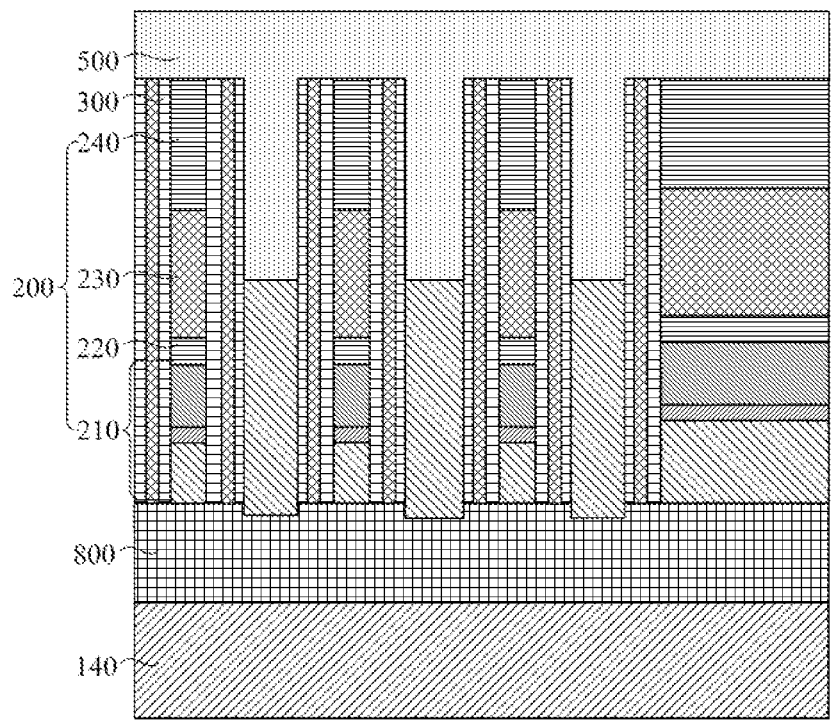
FIG. 14 is a cross-sectional view of a position C after an intermediate layer is formed according to an embodiment of this application.
Figure 15:
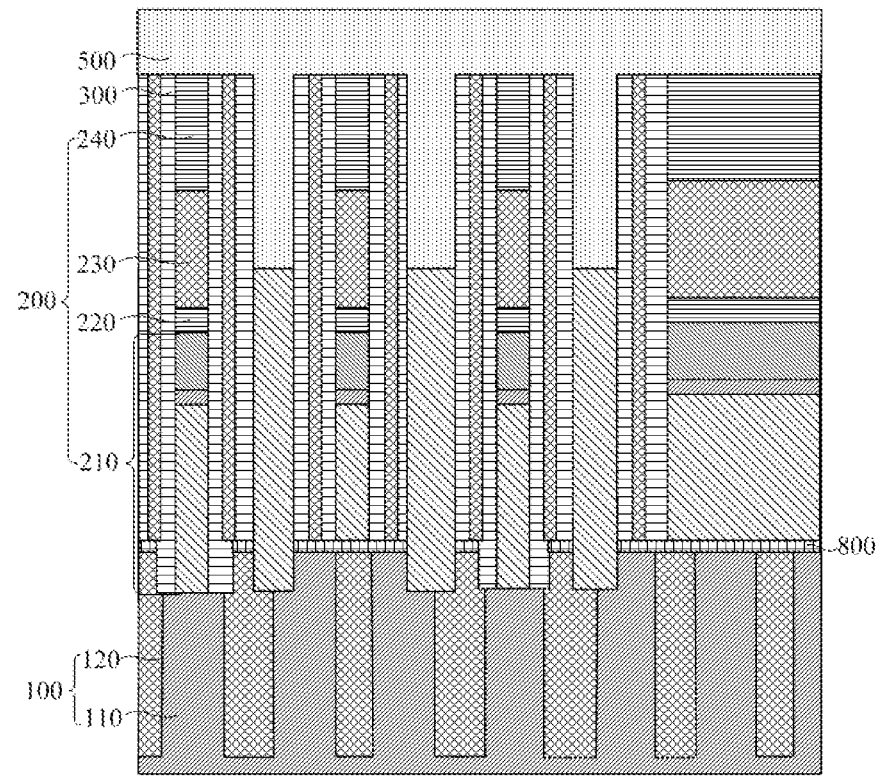
FIG. 15 is a cross-sectional view of a position D after an intermediate layer is formed according to an embodiment of this application.

After removing the parts of the second conductive layer 400 away from the substrate 100, an intermediate layer 500 is formed on the second conductive layer 400 and the intermediate layer 500 is filled in the first trench 310, as shown in FIG. 15. Referring to FIG. 14 to FIG. 17, the intermediate layer 500 is deposited in the exposed part of the first trench 310 and the intermediate layer 500 is located on the second conductive layer 400. That is, a lower portion of the first trench 310 is filled up with the second conductive layer 400 and an upper portion of the first trench 310 is filled up with the intermediate layer 500.

Such arrangement reduces a height of the second conductive layer 400, thereby reducing an etching depth of the second conductive layer 400 in subsequent etching of the second conductive layer 400. On one hand, by-products during etching of the second conductive layer 400 are reduced, and quality of the plurality of conducting wires 410 is improved. On the other hand, diffusion of the second conductive layer 400 can be reduced or even prevented, so as to improve the yield of the memory.

In some possible examples, the intermediate layer 500 may be Spin on Dielectrics (SOD), and the intermediate layer 500 is formed by spin coating a liquid insulation medium and performing a high temperature treatment to solidify the liquid insulation medium. The intermediate layer 500 may be an oxide such as silicon oxide.

Figure 16:
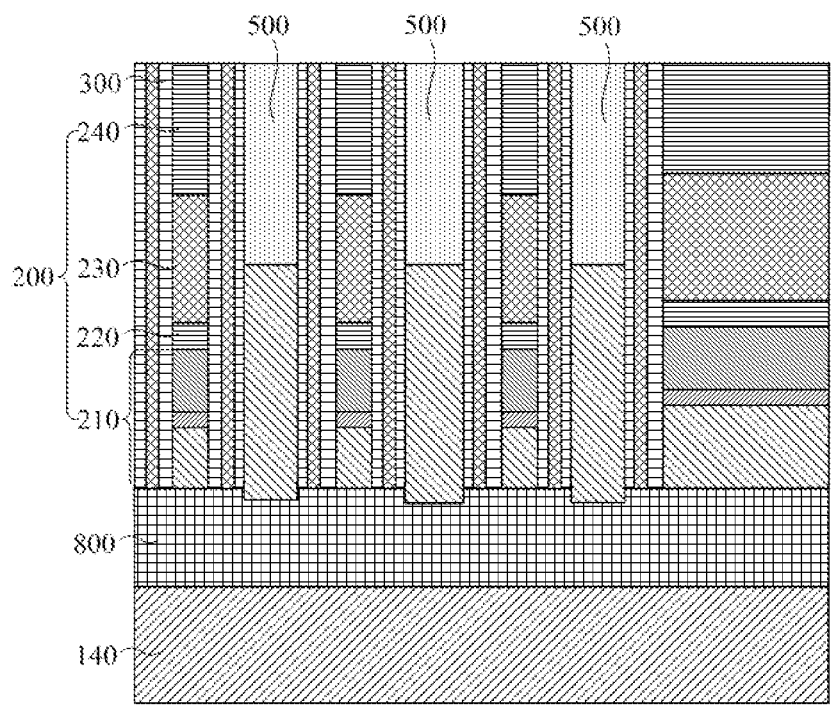
FIG. 16 is a cross-sectional view of a position C after an intermediate layer is planarized according to an embodiment of this application.
Figure 17:
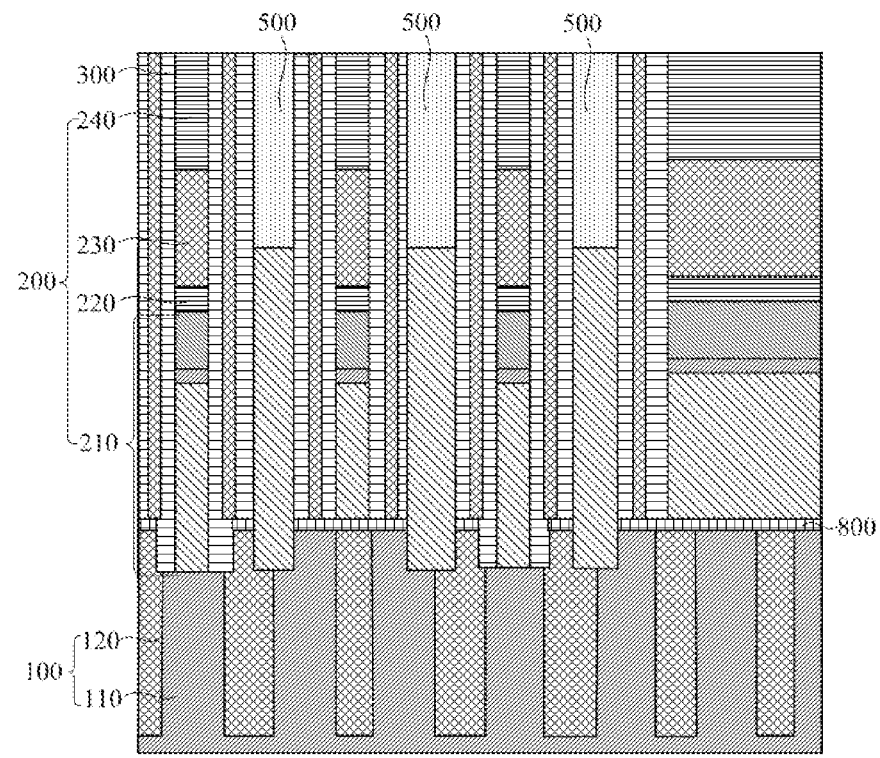
FIG. 17 is a cross-sectional view of a position D after an intermediate layer is planarized according to an embodiment of this application.

Specifically, the intermediate layer 500 may be formed by forming the intermediate layer 500 in the first trench 310 and on the first isolation layer 300, and the first trench 310 is filled up with the intermediate layer 500. As shown in FIG. 14 and FIG. 15, the intermediate layer 500 covers the first isolation layer 300 and the second conductive layer 400. A surface of the intermediate layer 500 away from substrate 100 is then planarized, to expose the first isolation layer 300. As shown in FIG. 16 and FIG. 17, an upper surface of the intermediate layer 500 is planarized.

Through planarization treatment, an upper surface of the first isolation layer 300 is exposed, that is, the first isolation layer 300 is flush with the intermediate layer 500. The intermediate layer 500 may be planarized by Chemical Mechanical Polishing (CMP) to obtain a relatively flat intermediate layer 500. Certainly, the planarization treatment is not limited. For example, the planarization treatment may further be performed by a multi-layer photoresist process.

Figure 18:
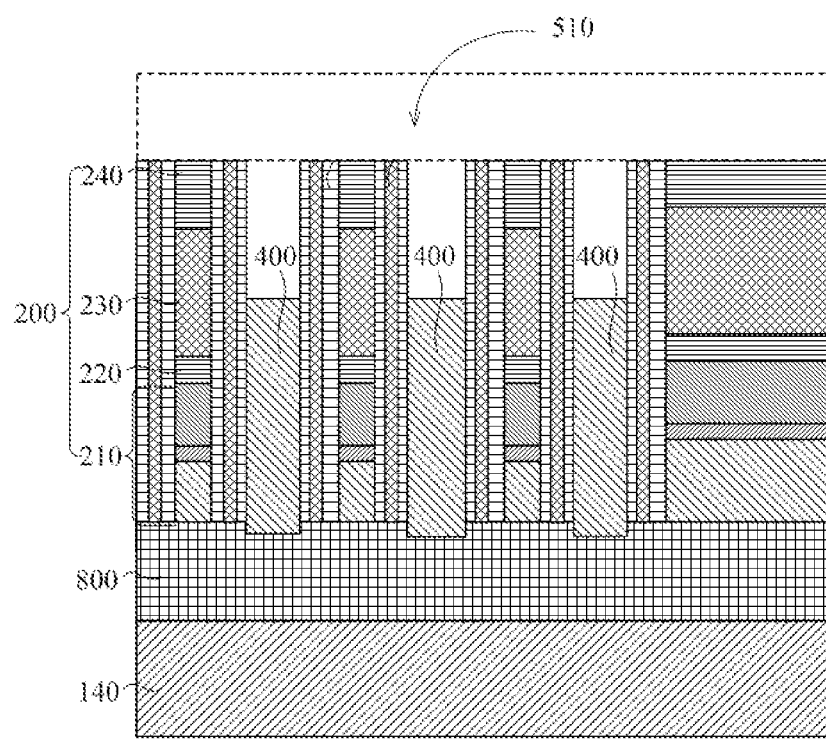
FIG. 18 is a cross-sectional view of a position C after parts of an intermediate layer are removed according to an embodiment of this application.
Figure 19:
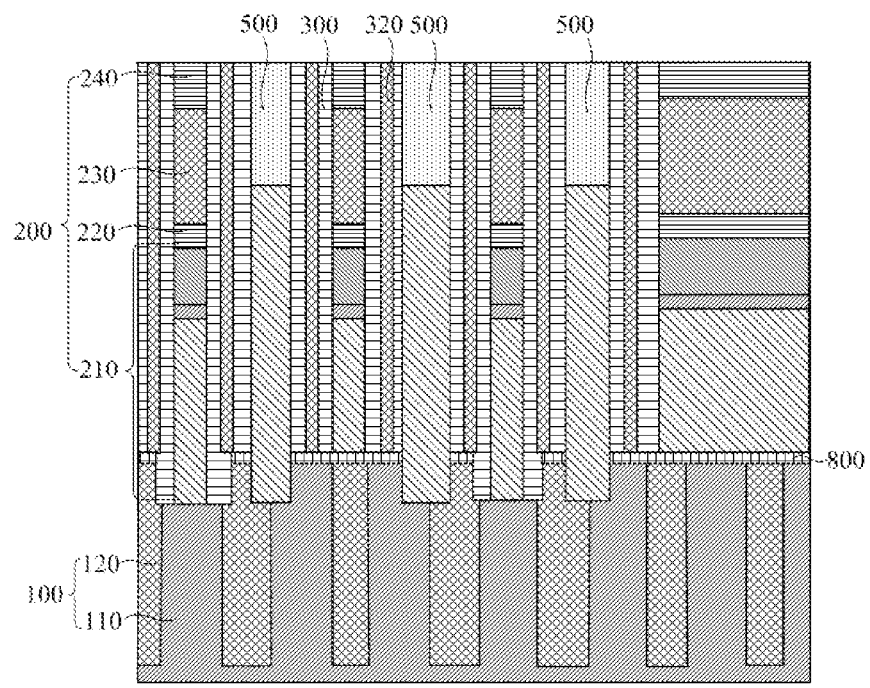
FIG. 19 is a cross-sectional view of a position D after parts of an intermediate layer are removed according to an embodiment of this application.

After the intermediate layer 500 is formed on the second conductive layer 400, parts of the intermediate layer 500 in regions of the second conductive layer 400 where the plurality of conducting wires 410 is not to be formed are removed. Referring to FIG. 18 and FIG. 19, when the parts of the intermediate layer 500 are etched, the remaining intermediate layer 500 covers the second conductive layer 400 which is subsequently used to form the plurality of conducting wires 410. It can be understood that the second conductive layer 400 below the remaining intermediate layer 500 forms the plurality of conducting wires 410.

It should be noted that when etching the parts of the intermediate layer 500, in a vertical direction as shown in FIG. 18 and FIG. 19, the second conductive layer 400 is disposed below the intermediate layer 500, and the second conductive layer 400 may be used as an etch stop layer of the intermediate layer 500, so that the second conductive layer 400 may form a self-aligned structure.

For example, parts of the intermediate layer 500 may be removed by a Capacitively Coupled Plasma (CCP) etching process, so that side surfaces of the remaining intermediate layer 500 are relatively upright.

Specifically, the parts of the intermediate layer 500 are etched using an etch gas including one or more of oxygen ($O_2$), argon (Ar), methane tetrafluoride (CF4), hexafluorobutadiene (C4F6), or octafluorocyclobutane (C4F8). It can be understood that the above-mentioned etch gas may also be used when the remaining intermediate layer 500 is subsequently etched.

It should be noted that when removing the parts of the intermediate layer 500, parts of the intermediate layer 500 and parts of the first isolation layer 300 to form a third trench 510 extending in a second direction. The third trench 510 is a region enclosed by dotted lines as shown in FIG. 18. The third trench 510 exposes the barrier layer 230. The second direction may be perpendicular to the first direction, that is, the second direction is perpendicular to the extending direction of the plurality of spaced bit lines 200.

It can be understood that parts of the sidewalls of the third trench 510 are the first isolation layer 300, parts of the sidewalls of the third trench 510 are the intermediate layer 500, and the intermediate layer 500 and the first isolation layer 300 are alternately arranged in the second direction. Parts of the bottom of the third trench 510 are the barrier layer 230, parts of the bottom of the third trench 510 are the intermediate layer 500, and the barrier layer 230 and the intermediate layer 500 are alternately arranged in the second direction. The barrier layer 230 located at the bottom of the third trench is then removed to expose the second conductive layer 400. As shown in FIG. 18 and FIG. 19, parts of the second conductive layer 400 are exposed, and parts of the second conductive layer 400 are located under the intermediate layer 500 and are not exposed. In the process of removing the parts of the intermediate layer 500, the bit lines 200 may also be etched. As shown in FIG. 18 and FIG. 19, parts of the second protection layer 240 in the bit lines 200 are also removed.

Referring to step S1052 of FIG. 9. Remove parts of the second conductive layer, to disconnect the second conductive layer and form a plurality of conducting wires.

Figure 20:
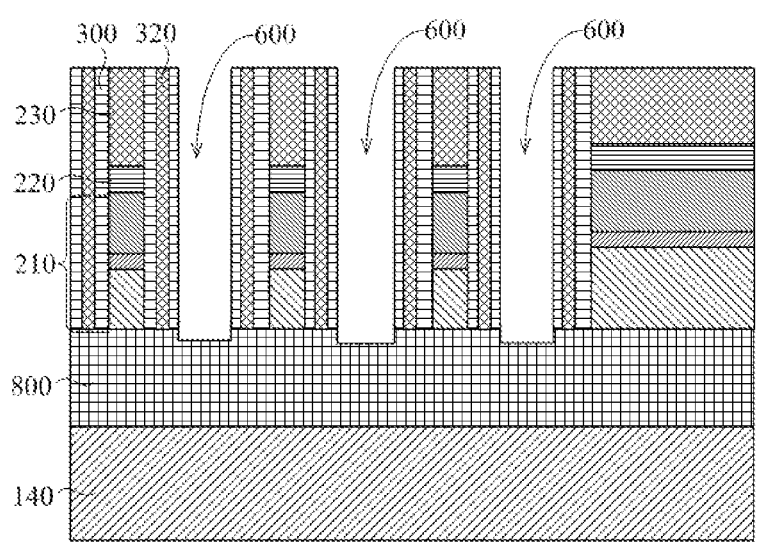
FIG. 20 is a cross-sectional view of a position C after conducting wires are formed according to an embodiment of this application.
Figure 21:
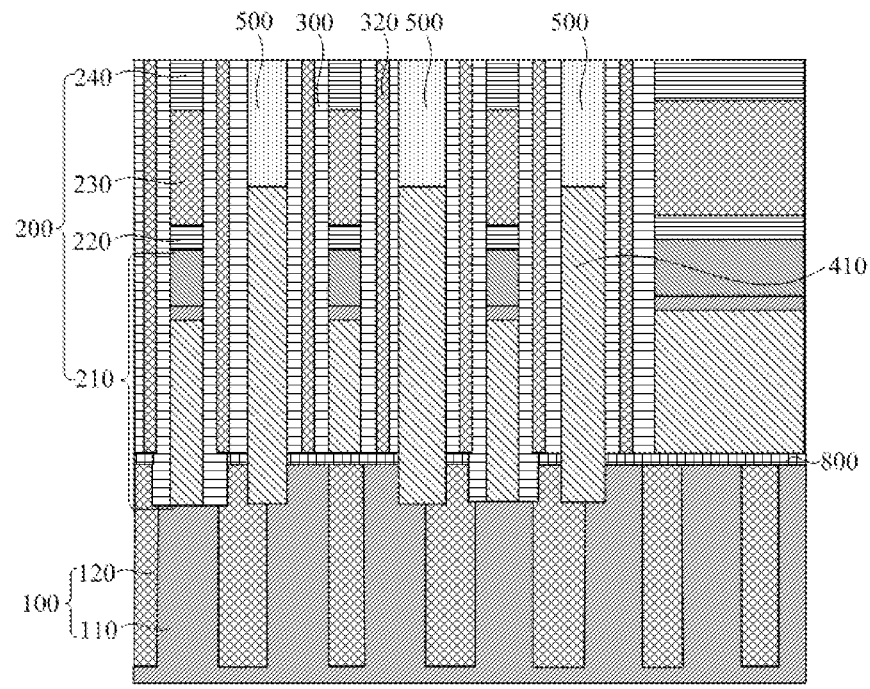
FIG. 21 is a cross-sectional view of a position D after conducting wires are formed according to an embodiment of this application.

Referring to FIG. 20 and FIG. 21, the second conductive layer 400 is etched to remove parts of the second conductive layer 400, and remaining second conductive layer 400 and the first isolation layer 300 enclose a plurality of fill holes 600, which may be formed by one-time etching.

The plurality of fill holes 600 partitions the second conductive layer 400 into a plurality of conducting wires 410, that is, the remaining second conductive layer 400 forms the plurality of conducting wires 410, each of which is electrically connected to the second contact region 112. For example, one active area may be connected to two conducting wires or one active area may be connected to one conducting wire.

In a possible example, as shown in FIG. 20 and FIG. 21, the intermediate layer 500 is disposed on the second conductive layer 400. Parts of the intermediate layer 500 away from the substrate 100 and parts of the first isolation layer 300 are etched to form a third trench. The intermediate layer 500 located at a bottom of the third trench are then etched, to expose parts of the second conductive layer 400. the exposed second conductive layer 400 is continuously etched, until the second contact region 112 of the substrate 100 is exposed.

When removing the parts of the second conductive layer 400, remaining intermediate layer 500 may be used as a mask of the second conductive layer 400, and parts of the second conductive layer 400 that are not covered by the intermediate layer 500 are etched without additionally disposing a mask, thus reducing the manufacturing steps.

For example, the second conductive layer 400 is etched using an etch gas including one or more of chlorine ($Cl_2$), hydrobromic acid (HBr), helium (He), argon (Ar), methane tetrafluoride (CF4), nitrogen trifluoride ($NF_3$), or trifluoromethane (CHF3). An etch stop layer for etching the second conductive layer 400 may be the third isolation layer 800.

It can be understood that an etch rate selectivity of the second conductive layer 400 to the barrier layer 230 is relatively large, and therefore when etching the second conductive layer 400, the barrier layer 230 is not apt to be etched after the second protection layer 240 is etched off, so that at least parts of the barrier layer 230 are retained to protect the first conductive layer 210 under the barrier layer 230 and prevent the first conductive layer 210 from being exposed. For example, the second conductive layer 400 is made of polycrystalline silicon and the barrier layer 230 is made of silicon oxide.

Referring to step S1053 of FIG. 9. Form the second isolation layers in fill holes that are enclosed by the plurality conducting wires and the first isolation layers.

Figure 22:
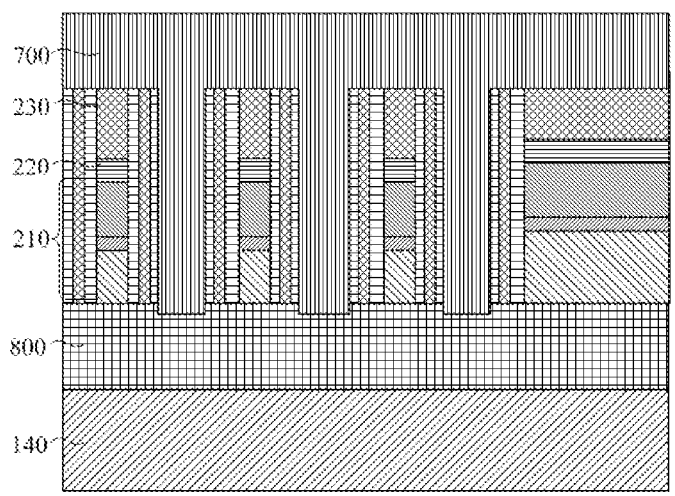
FIG. 22 is a cross-sectional view of a position C after a second isolation layer is formed according to an embodiment of this application.
Figure 23:
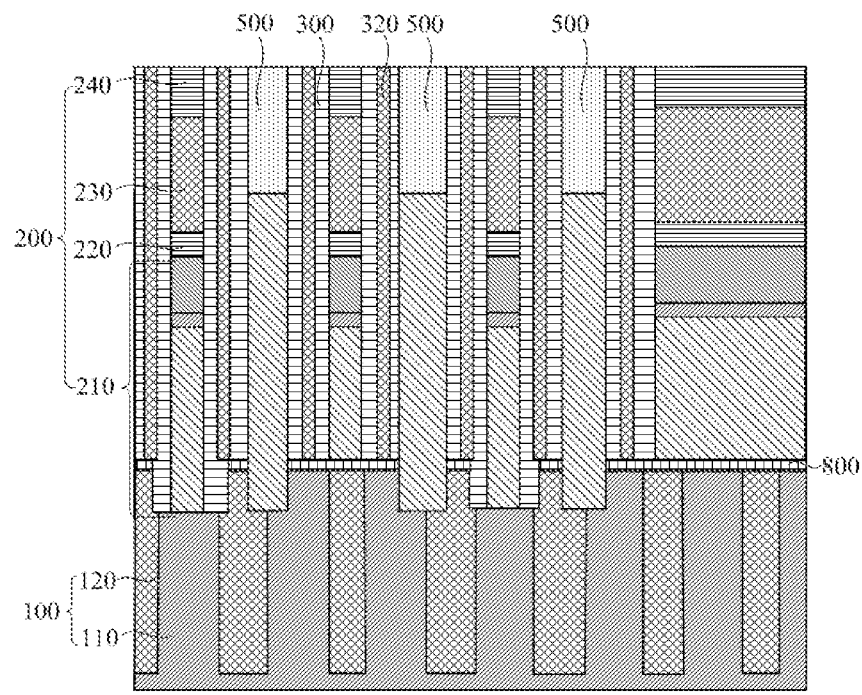
FIG. 23 is a cross-sectional view of a position D after a second isolation layer is formed according to an embodiment of this application.

Referring to FIG. 22 and FIG. 23, the second isolation layer 700 may be formed by a deposition process and the second isolation layer 700 may be an insulation material, such as silicon nitride, to electrically isolate the plurality of conducting wires 410 together with the first isolation layer 300. It can be understood that the plurality of conducting wires 410 is isolated by the first isolation layer 300 and the second isolation layers 700, to prevent two adjacent conducting wires from being conducted, thereby ensuring normal operations of the memory.

As shown in FIG. 22 and FIG. 23, forming the second isolation layer 700 in the fill holes 600 that are enclosed by the plurality of conducting wires 410 and the first isolation layers 300 includes: depositing the second isolation layer 700 in the fill hole 600 and the third trench.

Figure 24:
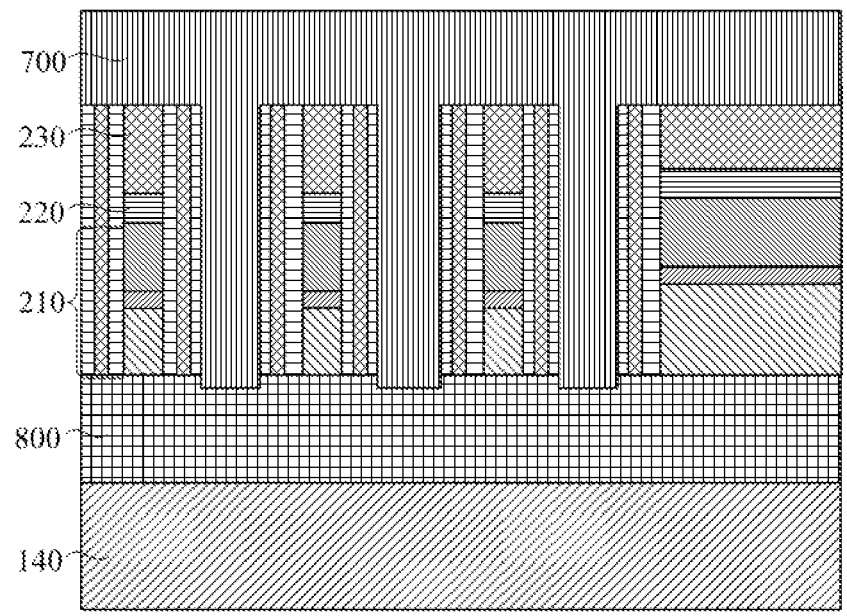
FIG. 24 is a cross-sectional view of a position C after remaining intermediate layer is removed according to an embodiment of this application.
Figure 25:
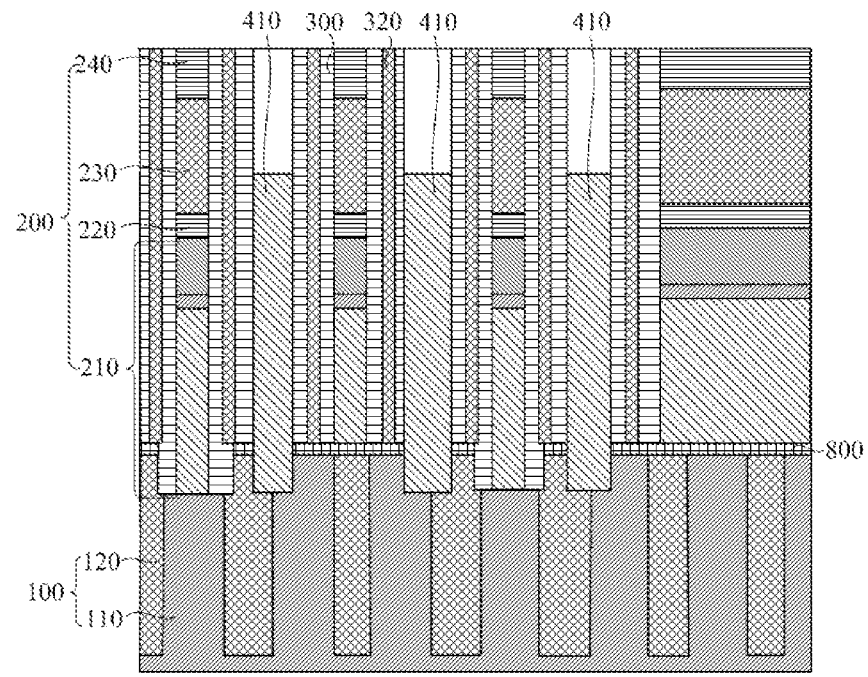
FIG. 25 is a cross-sectional view of a position D after remaining intermediate layer is removed according to an embodiment of this application.

Referring to FIG. 24 and FIG. 25, after the second isolation layer 700 is formed, the remaining intermediate layer 500 is removed, so as to expose the conducting wires 410. As shown in FIG. 24 and FIG. 25, a top surface of the second isolation layer 700 is flush with the top surface of the first isolation layer 300 and higher than the top surfaces of the conducting wires 410. That is, the plurality of conducting wires 410 is recessed toward the substrate 100 with respect to the first isolation layer 300 and the second isolation layer 700.

After the second isolation layer 700 is formed, regions enclosed by the first isolation layer 300 and the second isolation layers 700 do not need to be etched, so that the risk of etching damage to the first isolation layer 300 is reduced, thereby reducing the risk of exposure of the first conductive layer 210 and improving the yield of the memory.

Figure 26:
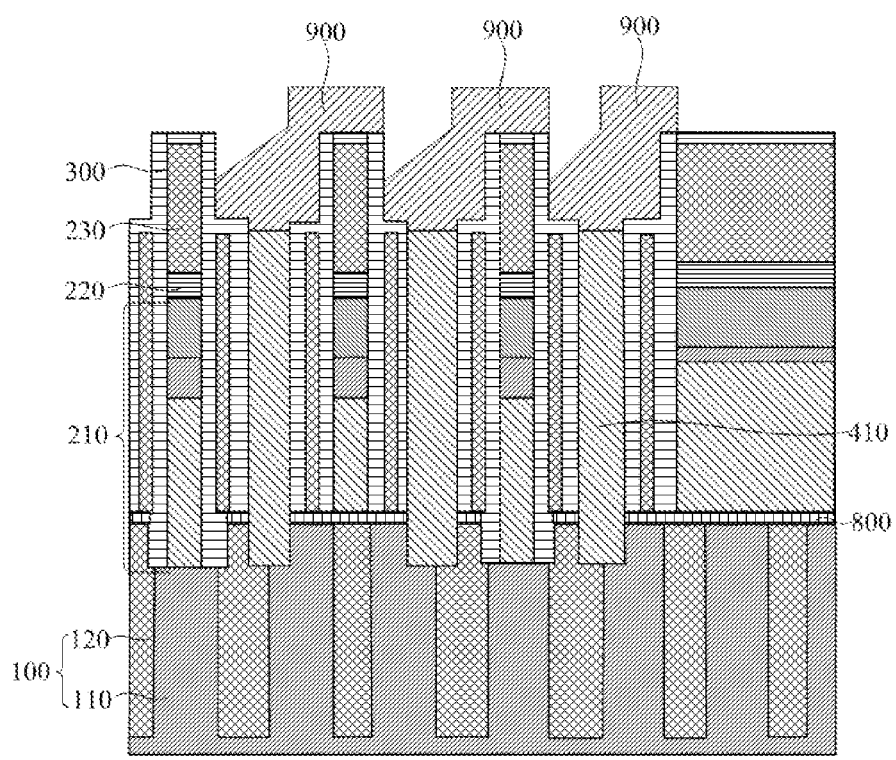
FIG. 26 is a cross-sectional view of a position D after capacitively contact pads are formed according to an embodiment of this application.

It should be noted that after the plurality of conducting wires 410 are exposed, a capacitively contact pad 900 is formed on each of the plurality of conducting wires 410. As shown in FIG. 26, a plurality of capacitively contact pads 900 are provided, the plurality of capacitively contact pads 900 are in a one-to-one correspondence to the plurality of conducting wires 410, and the corresponding capacitively contact pads 900 are electrically connected to the conducting wires 410.

Now referring back to FIG. 1 to FIG. 3, an embodiment of this application further provides a memory, including: a substrate 100, a plurality of spaced bit lines 200 formed on the substrate 100, and an isolation layer covering the plurality of spaced bit lines 200. As shown in FIG. 1, the substrate 100 includes a plurality of spaced active area 110. For example, the plurality of active area 110 are arranged in an array.

As shown in FIG. 1 to FIG. 3, STI structures 120 are provided between the plurality of active area 110 and silicon oxide is provided in the STI structures 120 to isolate the plurality of active area 110. The active area 110 may include silicon.

Referring to FIG. 1 to FIG. 3, each of the plurality of spaced active area 110 includes a first contact region 111 and a second contact region 112. For example, the first contact region 111 is adjacent to the second contact regions 112, the first contact region 111 is located at a center of each of the plurality of spaced active area 110, and the second contact regions 112 are located at both ends of each of the plurality of spaced active area 110, that is, the second contact regions 112 are located on both sides of the first contact region 111. The first contact regions 111 are configured to be connected to the plurality of spaced bit lines 200 and the second contact regions 112 are configured to be connected to a capacitor.

Each of the plurality of spaced bit line 200 passes through first contact regions 111 of several active area 110. As shown in FIG. 2, each of the plurality of spaced bit line 200 passes through a plurality of active area 110 in the same column and is located on the first contact regions 111 of the plurality of spaced active area 110. Each of the plurality of spaced bit lines 200 includes a first conductive layer 210, a first protection layer 220, and a barrier layer 230 stacked in sequence, the first conductive layer 210 being located on the substrate 100. It can be understood that the first protection layer 220 is disposed on the first conductive layer 210 and the barrier layer 230 is disposed on the first protection layer 220.

The first conductive layer 210 is configured to be electrically connected to the plurality of spaced active area 110. The first conductive layer 210 may be of a stack structure. For example, the first conductive layer 210 includes a polycrystalline silicon layer disposed on the substrate 100, a silicon nitride layer disposed on the polycrystalline silicon layer, and a tungsten layer disposed on the silicon nitride layer. That is, the tungsten layer is disposed at an end away from the substrate 100.

The first protection layer 220 isolates and protects the first conductive layer 210. A thickness of the first protection layer 220 may be in a range of 20 nm to 40 nm, and the first protection layer 220 may be an insulation material. For example, the first protection layer 220 is silicon nitride. The thickness of the first protection layer 220 refers to a height of the first protection layer 220 in a direction away from the substrate 100.

The thickness of the barrier layer 230 is in a range of 20 nm to 80 nm. The material of the barrier layer 230 is correlated to the material of the conducting wires 410 to be formed subsequently. An etch rate selectivity of the conducting wires 410 to the barrier layer 230 is relatively great, so that in the process of etching the second conductive layer 400 to form the conducting wires 410, the barrier layer 230 is less etched, and further it is difficult to etch to the first conductive layer 210, thereby reducing risk of exposing the first conductive layer 210 and improving yield of the memory. For example, an etch rate selectivity of the conducting wires 410 to the barrier layer 230 is greater than 100, the conducting wires 410 are made of polycrystalline silicon, and the barrier layer 230 is made of silicon oxide.

Still referring to FIG. 1 to FIG. 3, each of the plurality of spaced bit lines 200 may further include a second protection layer 240, which is disposed on the barrier layer 230. The thickness of the second protection layer 240 is in a range of 20 nm to 80 nm, and the material of the second protection layer 240 may be the same as that of the first isolation layer 300. For example, the second protection layer 240 includes silicon nitride.

As shown in FIG. 1 to FIG. 3, the isolation layer covers the plurality of spaced bit lines 200 and the substrate 100. The isolation layer is usually an insulation material, to further protect and isolate the plurality of spaced bit lines 200. The isolation layer is provided with vias running through the isolation layer to accommodate the plurality of conducting wires 410. Top surfaces of the plurality of conducting wires 410 may be lower than a top surface of the isolation layer, that is, the plurality of conducting wires 410 does not fill up the vias. As shown in FIG. 1, the plurality of conducting wires 410—is recessed with respect to the isolation layer, to facilitate the forming of other spaced structures, such as capacitively contact pads, on the plurality of conducting wires 410.

A plurality of oxide layers 320, such as silicon oxide, may further be provided in the isolation layer. Both sides of each of the plurality of bit lines 200 are each provided with an oxide layer 320. The oxide layer 320 extends in the first direction, that is, the extending direction of the oxide layer 320 is the same as the extending direction of the bit lines 200.

In a possible example, a difference between a height of top surfaces of the plurality of conducting wires 410 and a height of a top surface of the first conductive layer 210 is in a range of −15 nm to 30 nm. As shown in FIG. 1, the height of the top surfaces of the plurality of conducting wires 410 refers to the distance between the top surfaces of the plurality of conducting wires 410 and a top surface of the substrate 100. The height of the top surface of the first conductive layer 210 refers to the distance between the top surface of the first conductive layer 210 and the top surface of the substrate 100. The difference between the height of the top surfaces of the plurality of conducting wires 410 and the height of the top surface of the first conductive layer 210 is a value obtained by subtracting the height of the top surfaces of the conducting wires 410 by the height of the top surface of the first conductive layer 210.

Each of the plurality of conducting wires 410 may extend into the substrate 100 and be in contact with a part of the plurality of spaced active area 110, for example, in contact with the second contact region 112 in the plurality of space active area 110. There is an isolation layer between the vias and the plurality of spaced bit lines 200, so that the plurality of conducting wires 410 is not directly conducted to the plurality of spaced bit lines 200. It can be understood that the top surface of the substrate 100 is provided with contact recesses opposite to and communicated with the vias and the plurality of conducting wires 410 are filled in the contact recesses and the vias.

A memory according to an embodiment of this application includes a substrate 100, a plurality of spaced bit lines 200 formed on the substrate 100, an isolation layer covering the plurality of spaced bit lines 200 and the substrate 100, and a plurality of conducting wires 410 disposed in the isolation layer and extending to the substrate 100. The substrate 100 includes a plurality of spaced active area 110. Each of the plurality of spaced active area 110 includes a first contact region 111 and a second contact region 112. Each of the plurality of spaced bit lines 200 is connected to at least one first contact region. Each of the plurality of spaced bit lines 200 includes a first conductive layer 210, a first protection layer 220, and a barrier layer 230 stacked in sequence, the first conductive layer 210 being located on the substrate 100. By disposing the barrier layer 230 on the first conductive layer 210, the barrier layer 230 is difficult to remove, and the barrier layer 230 can reduce risk of exposing the first conductive layer 210, thereby avoiding electrical connections between the plurality of spaced bit line 200 and another structure, to improve yield of a memory. The isolation layer is provided with vias running through the isolation layer. The plurality of conducting wires 410 extending into the substrate 100 and electrically connected to the second contact regions 112 is provided in the vias. Each of the plurality of conducting wires 410 is further electrically connected to a capacitive contact pad, which is electrically connected to a capacitor, so that the capacitor is electrically connected to the plurality of space bit line 200 through which data information stored in the capacitor can be read or data information can be written to the capacitor.

Embodiments or implementations in this specification are described in a progressive manner, each embodiment emphatically illustrating differences from other embodiments, and the same and similar parts between the embodiments can be referred to each other.

In the description of this specification, the description with reference to "one embodiment", "some embodiments", "exemplary embodiments", "example", "specific example", or "some examples" means that specific features, structures, materials, or features described in combination with the embodiments or examples are included in at least one embodiment or example of this application. In this specification, schematic representations of the above-mentioned terms do not necessarily refer to the same embodiments or examples. Further, the specific features, structures, materials, or features described may be combined in a suitable manner in any one or more embodiments or examples.

Finally, it should be noted that the above embodiments are only used to illustrate the technical solution of this application, but not limited thereto. Although this application has been described in detail with reference to the foregoing embodiments, a person of ordinary skill in the art should understand that modifications to the technical solutions described in the foregoing embodiments, or equivalent replacements of some or all of the technical features thereof can be made, so that the essence of the corresponding technical solution does not depart from the scope of the technical solution of each embodiment of this application.

What is claimed is:

1. A method for manufacturing a memory, comprising:
providing a substrate, wherein the substrate comprises a plurality of spaced active area and each of the plurality of spaced active area comprises a first contact region and a second contact region;
forming a plurality of spaced bit lines on the substrate, wherein each of the plurality of spaced bit lines is connected to at least one first contact region; and each of the plurality of spaced bit lines comprises a first conductive layer, a first protection layer, and a barrier layer stacked in sequence, the first conductive layer being located on the substrate;
forming a first isolation layer on each of the plurality of spaced bit lines, a first trench extending in a first direction between two adjacent first isolation layers of the plurality of spaced bit lines;
etching a bottom along the first trench to form a second trench, the second trench exposing the second contact region; and
forming a plurality of conducting wires and a plurality of second isolation layers in the second trench, top surfaces of the plurality of conducting wires and top surfaces of the plurality of second isolation layers being located in the first trench, the plurality of conducting wires and the plurality of second isolation layers being alternately arranged in the first direction, and each of the plurality of conducting wires being connected to one second contact region, wherein each of the plurality of spaced bit lines further comprises a second protection layer disposed on the barrier layer, and a thickness of the second protection layer is in a range of 20 nm to 80 nm, and wherein the first conductive layer comprises polycrystalline silicon, silicon nitride, and tungsten, the first and second protection layers comprise silicon nitride, and the barrier layer comprises silicon oxide.

2. The method for manufacturing the memory according to claim 1, wherein an etch rate selectivity of the plurality of conducting wires to the barrier layer is greater than 100.

3. The method for manufacturing the memory according to claim 1, wherein a thickness of the first protection layer is in a range of 20 nm to 40 nm, and a thickness of the barrier layer is in a range of 20 nm to 80 nm.

4. The method for manufacturing the memory according to claim 1, wherein a difference between a height of the top surfaces of the plurality of conducting wires and a height of a top surface of the first conductive layer is in a range of −15 nm to 30 nm.

5. The method for manufacturing the memory according to claim 1, wherein forming the plurality of conducting wires and the plurality of second isolation layers in the second trench comprises:
filling a conductive material in the first trench and the second trench to form a second conductive layer;
removing parts of the second conductive layer to disconnect the second conductive layer to form the plurality of conducting wires; and forming the second isolation layers in fill holes that are enclosed by the plurality of conducting wires and the first isolation layer.

6. The method for manufacturing the memory according to claim 5, wherein after filling the conductive material in the first trench and the second trench to form the second conductive layer, the method further comprises:
removing parts of the second conductive layer away from the substrate to expose parts of the first trench;
forming an intermediate layer on the second conductive layer, the intermediate layer being filled in the first trench; and
removing parts of the intermediate layer in regions of the second conductive layer where the conducting wires are not to be formed.

7. The method for manufacturing the memory according to claim 6, wherein removing the parts of the intermediate layer comprises:
removing the parts of the intermediate layer and parts of the first isolation layer to form a third trench extending in a second direction, the third trench exposing the barrier layer.

8. The method for manufacturing the memory according to claim 7, wherein forming the second isolation layers in fill holes that are enclosed by the conducting wires and the first isolation layers comprises:
depositing the second isolation layers in the fill holes and the third trench.

9. The method for manufacturing the memory according to claim 6, further comprising:
removing the parts of the intermediate layer using an etch gas comprising one or more of oxygen, argon, methane tetrafluoride, hexafluorobutadiene, or octafluorocyclobutane.

10. The method for manufacturing the memory according to claim 6, wherein forming the intermediate layer on the second conductive layer comprises:
forming the intermediate layer in the first trench and on the first isolation layers, the first trench being filled up with the intermediate layer; and
planarizing a surface of the intermediate layer away from the substrate, to expose the first isolation layers.

11. The method for manufacturing the memory according to claim 5, further comprising:
removing the parts of the second conductive layer using an etch gas comprising one or more of chlorine, hydrobromic acid, helium, argon, methane tetrafluoride, nitrogen trifluoride, or trifluoromethane.

12. A method for manufacturing a memory, comprising:
providing a substrate, wherein the substrate comprises a plurality of spaced active area and each of the plurality of spaced active area comprises a first contact region and a second contact region;
forming a plurality of spaced bit lines on the substrate, wherein each of the plurality of spaced bit lines is connected to at least one first contact region; and each of the plurality of spaced bit lines comprises a first conductive layer, a first protection layer, and a barrier layer stacked in sequence, the first conductive layer being located on the substrate;
forming a first isolation layer on each of the plurality of spaced bit lines, a first trench extending in a first direction between two adjacent first isolation layers of the plurality of spaced bit lines;
etching a bottom along the first trench to form a second trench, the second trench exposing the second contact region; and
forming a plurality of conducting wires and a plurality of second isolation layers in the second trench, top surfaces of the plurality of conducting wires and top surfaces of the plurality of second isolation layers being located in the first trench, the plurality of conducting wires and the plurality of second isolation layers being alternately arranged in the first direction, and each of the plurality of conducting wires being connected to one second contact region, wherein forming the plurality of conducting wires and the plurality of second isolation layers in the second trench comprises:
filling a conductive material in the first trench and the second trench to form a second conductive layer;
removing parts of the second conductive layer to disconnect the second conductive layer to form the plurality of conducting wires; and
forming the second isolation layers in fill holes that are enclosed by the plurality of conducting wires and the first isolation layer,
and wherein after filling the conductive material in the first trench and the second trench to form the second conductive layer, the method further comprises:
removing parts of the second conductive layer away from the substrate to expose parts of the first trench;
forming an intermediate layer on the second conductive layer, the intermediate layer being filled in the first trench; and
removing parts of the intermediate layer in regions of the second conductive layer where the conducting wires are not to be formed.

13. The method for manufacturing the memory according to claim 12, wherein an etch rate selectivity of the plurality of conducting wires to the barrier layer is greater than 100.

14. The method for manufacturing the memory according to claim 12, wherein a thickness of the first protection layer is in a range of 20 nm to 40 nm, and a thickness of the barrier layer is in a range of 20 nm to 80 nm.

15. The method for manufacturing the memory according to claim 12, wherein each of the plurality of spaced bit lines further comprises a second protection layer disposed on the barrier layer, and a thickness of the second protection layer is in a range of 20 nm to 80 nm.

16. The method for manufacturing the memory according to claim 12, wherein a difference between a height of the top surfaces of the plurality of conducting wires and a height of a top surface of the first conductive layer is in a range of −15 nm to 30 nm.

17. The method for manufacturing the memory according to claim 12, wherein removing the parts of the intermediate layer comprises:
removing the parts of the intermediate layer and parts of the first isolation layer to form a third trench extending in a second direction, the third trench exposing the barrier layer.

18. The method for manufacturing the memory according to claim 17, wherein forming the second isolation layers in fill holes that are enclosed by the conducting wires and the first isolation layers comprises:
depositing the second isolation layers in the fill holes and the third trench.

19. The method for manufacturing the memory according to claim 12, further comprising:
removing the parts of the intermediate layer using an etch gas comprising one or more of oxygen, argon, methane tetrafluoride, hexafluorobutadiene, or octafluorocyclobutane.

20. The method for manufacturing the memory according to claim 12, wherein forming the intermediate layer on the second conductive layer comprises:
- forming the intermediate layer in the first trench and on the first isolation layers, the first trench being filled up with the intermediate layer; and
- planarizing a surface of the intermediate layer away from the substrate, to expose the first isolation layers.

\* \* \* \* \*